US009842551B2

(12) United States Patent
Yamashita et al.

(10) Patent No.: US 9,842,551 B2
(45) Date of Patent: Dec. 12, 2017

(54) DISPLAY DRIVER CIRCUITRY WITH BALANCED STRESS

(71) Applicant: Apple Inc., Cupertino, CA (US)

(72) Inventors: Keitaro Yamashita, Nishinomiya (JP); Ting-Kuo Chang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 19 days.

(21) Appl. No.: 14/549,475

(22) Filed: Nov. 20, 2014

(65) Prior Publication Data

US 2015/0356934 A1 Dec. 10, 2015

Related U.S. Application Data

(63) Continuation-in-part of application No. 14/301,121, filed on Jun. 10, 2014, now abandoned.

(51) Int. Cl.
*G09G 3/36* (2006.01)
*G11C 19/28* (2006.01)
*G09G 3/20* (2006.01)

(52) U.S. Cl.
CPC ......... *G09G 3/3611* (2013.01); *G09G 3/3677* (2013.01); *G11C 19/28* (2013.01); *G09G 3/20* (2013.01); *G09G 2300/0439* (2013.01); *G09G 2310/0224* (2013.01); *G09G 2310/0267* (2013.01); *G09G 2310/0286* (2013.01); *G09G 2310/08* (2013.01); *G09G 2330/04* (2013.01)

(58) Field of Classification Search
CPC .......... G09G 3/3611; G09G 2310/061; G09G 2310/065; G09G 2310/08; G06F 3/041
See application file for complete search history.

(56) References Cited

U.S. PATENT DOCUMENTS

| | | | |
|---|---|---|---|
| 6,956,601 B2 | 10/2005 | Squilla et al. |
| 7,907,833 B2 | 3/2011 | Lee |
| 7,926,080 B2 | 4/2011 | Baldwin et al. |
| 8,004,502 B2 | 8/2011 | Kean |
| 8,582,645 B2 | 11/2013 | Mathew et al. |
| 8,655,158 B2 | 2/2014 | Haddad |

(Continued)

FOREIGN PATENT DOCUMENTS

GB 2343067 4/2000

OTHER PUBLICATIONS

Lin et al., U.S. Appl. No. 61/935,772, filed Feb. 4, 2014.

*Primary Examiner* — Kevin M Nguyen
(74) *Attorney, Agent, or Firm* — Treyz Law Group, P.C.; Jason Tsai

(57) ABSTRACT

A touch screen display may include gate line driver circuitry coupled to a display pixel array. The display may be provided with intra-frame pausing (IFP) capabilities, where touch or other operations may be performed during one or more intra-frame blanking intervals. In one suitable arrangement, a gate driver circuit may include multiple gate line driver segments each of which is activated by a separate gate start pulse is that received through a demultiplexing circuit. In another suitable embodiment, the gate driver circuit may include analog or digital gate driver units that include control circuits for selectively (dis)charging internal nodes in the gate driver circuit so as to balance the amount of stress that is experienced by a drive transistor in gate driver units at or near an IFP row and the amount of stress that is experienced by the remaining gate driver units.

16 Claims, 26 Drawing Sheets

(56) References Cited

U.S. PATENT DOCUMENTS

| | | | |
|---|---|---|---|
| 2008/0080661 A1* | 4/2008 | Tobita | G11C 19/28 |
| | | | 377/78 |
| 2010/0007635 A1* | 1/2010 | Kwon | G09G 3/3677 |
| | | | 345/204 |
| 2011/0116592 A1* | 5/2011 | Tsai | G11C 19/184 |
| | | | 377/79 |
| 2011/0222645 A1* | 9/2011 | Tobita | G09G 3/3677 |
| | | | 377/78 |
| 2012/0140051 A1 | 6/2012 | Tabor | |
| 2013/0266113 A1* | 10/2013 | Tsuge | H03K 3/00 |
| | | | 377/64 |
| 2013/0314360 A1* | 11/2013 | Saitoh | G06F 3/0412 |
| | | | 345/173 |
| 2013/0342481 A1* | 12/2013 | Small | G06F 3/0412 |
| | | | 345/173 |
| 2014/0035891 A1* | 2/2014 | Tanaka | G09G 3/20 |
| | | | 345/204 |
| 2014/0210752 A1* | 7/2014 | Katsuta | G06F 3/0418 |
| | | | 345/173 |
| 2014/0267156 A1* | 9/2014 | Koga | G06F 3/044 |
| | | | 345/174 |

* cited by examiner

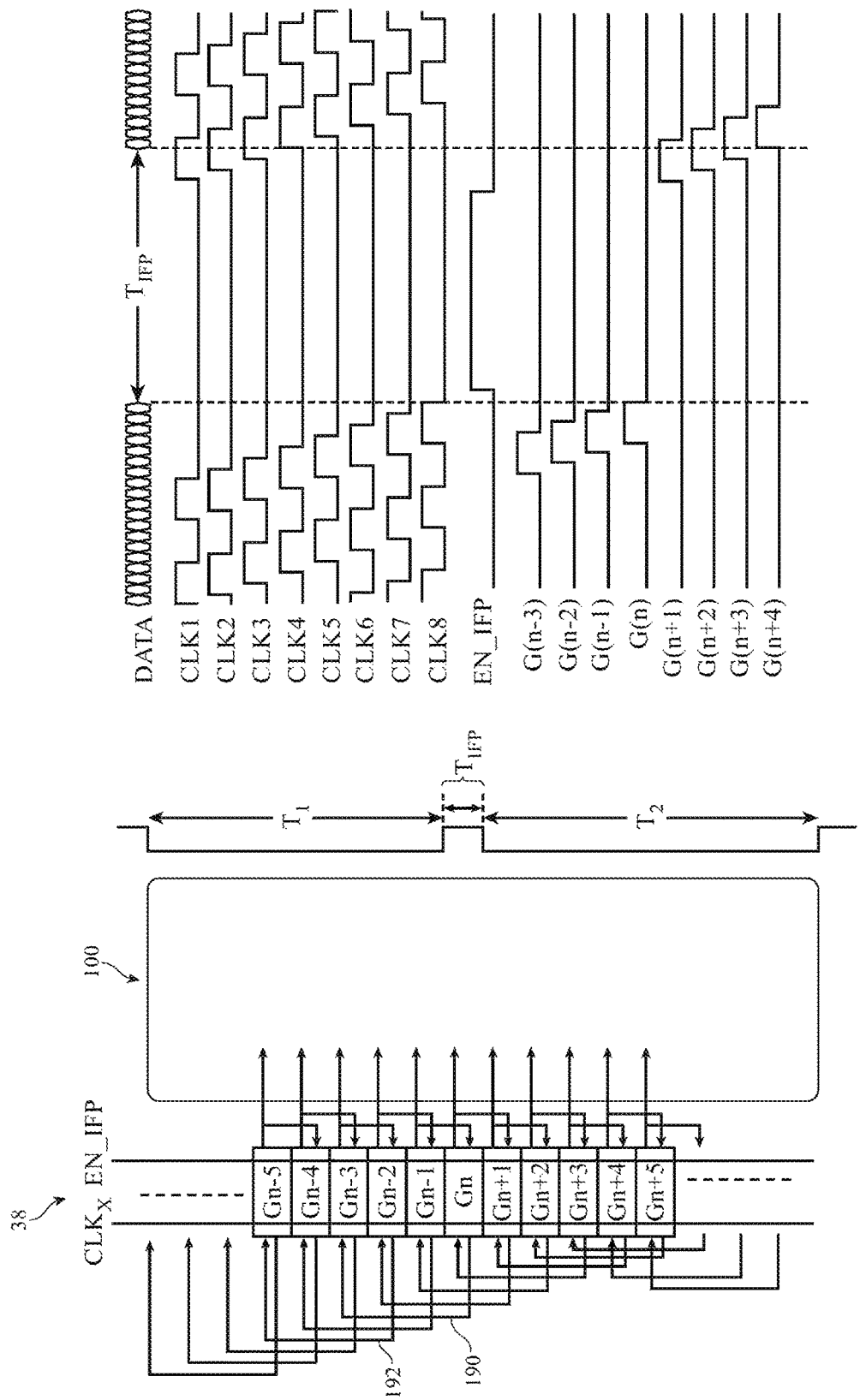

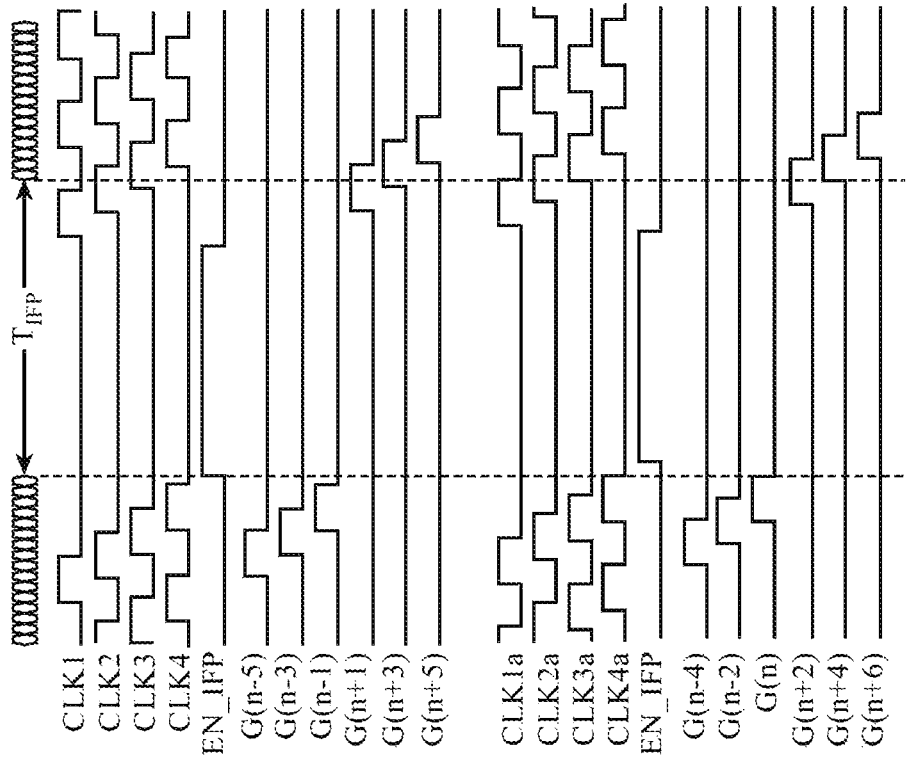
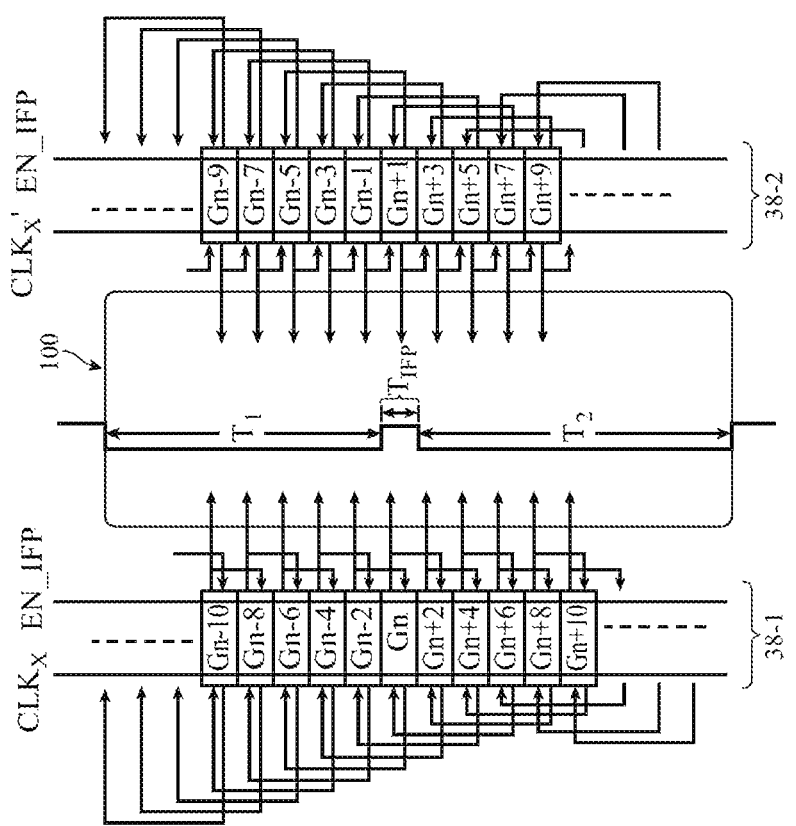
FIG. 7B
FIG. 7A

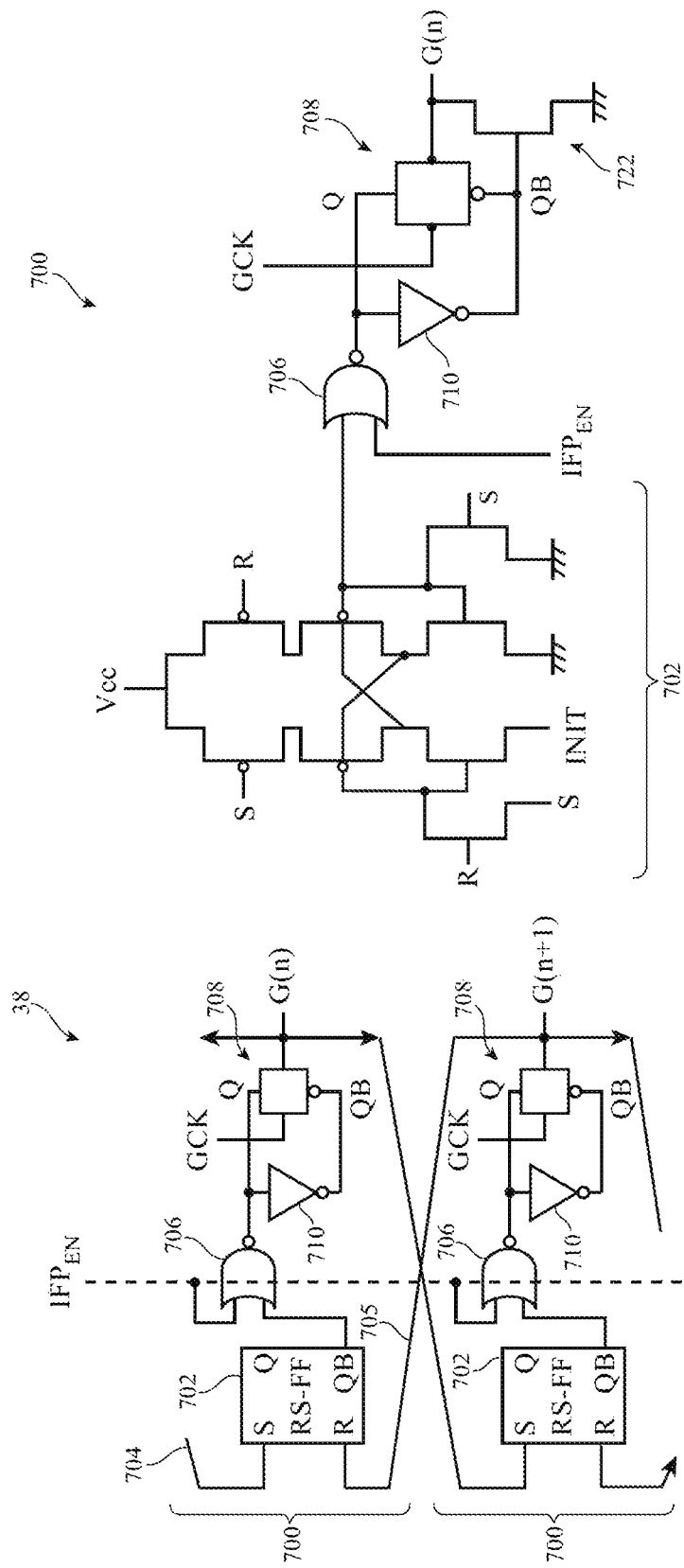

DISPLAY DRIVER CIRCUITRY WITH BALANCED STRESS

This application is a continuation-in-part of patent application Ser. No. 14/301,121, filed Jun. 10, 2014, which is hereby incorporated by reference herein in its entirety. This application claims the benefit of and claims priority to patent application Ser. No. 14/301,121, filed Jun. 10, 2014.

BACKGROUND

This relates generally to electronic devices, and more particularly, to electronic devices with touch screen displays.

Touch screen displays are prevalent in many applications, including consumer electronics devices such as smartphones, tablet devices, and laptop and desktop computers. The display function in such devices is typically performed by a liquid crystal display (LCD), plasma, or organic light emitting diode (OLED) display element array that is connected to a grid of source (data) and gate (select) metal traces. The display element array is often formed on a transparent panel such as a glass panel, which serves as a protective shield. The data and select lines of the display element array may be driven by a display driver integrated circuit (IC). The driver IC receives an image or video signal, which it then decodes into raster scan pixel values (color or gray scale) and writes them to the display element array during each frame, by driving the data and select lines. This process is repeated at a high enough frame rate so as to render video.

The touch gesture detection function in such devices is typically performed using a capacitance sensing subsystem in which a touch transducer grid structure overlays the display element array. The touch transducer structure is stimulated and sensed by touch controller circuitry. A touch stimulus signal is applied to the row segments of the grid, while simultaneously sensing the column segments (to detect a single-touch or a multi-touch gesture). Touch detection is typically performed during a blanking interval portion of the frame, while the display function is performed during a display interval portion of the frame.

The touch transducer grid structure can be implemented as a light transparent electrode plate that covers the display element array and may be formed on a rear surface of the protective panel. In some cases, the transparent electrode plate is also connected to the display elements, serving to deliver a "common voltage" to the display elements from a voltage source circuit often referred to as a Vcom conditioning circuit. The Vcom conditioning circuit helps improve the display function by adjusting a voltage on the transparent conductor plate that changes the light modulation characteristics of the connected display elements (during the display interval). As such, the transparent electrode plate is dual purposed in that it is used for both the display function and as the touch transducer grid structure.

As such, the touch screen display alternates between the display interval during which the display element array is activated and the blanking (or touch) interval during which the touch gesture detection function is activated. During each display interval, an entire frame is loaded into the display element array. The touch interval is typically positioned between successive display intervals (i.e., each touch interval occurs only after an entire frame has been scanned in). Performing inter-frame touch detection in this way may not be frequent enough for certain applications.

SUMMARY

An electronic device having a liquid crystal display (LCD) is provided. The liquid crystal display may include display pixel circuitry formed on a glass substrate. Thin-film transistor structures may be formed on the glass substrate.

The display pixel circuitry may include a display pixel array and gate driver circuitry coupled to the array. The gate driver circuitry may include at least one gate driver circuit that is formed on one side of the array. The gate driver circuit may include multiple gate driver units, each of which is configured to output a gate line output signal to display pixels arranged along a corresponding row in the array.

The display pixel circuitry may be used to output a given image/video frame. The gate driver circuitry may be configured to load a first sub-frame in the given frame during a first display interval and to load a second sub-frame in the given frame during a second display interval. Touch sensing operations may be performed during an intra-frame blanking interval (sometimes referred to as an intra-frame pause or "IFP") inserted immediately after the first display interval and immediately before the second display interval. Each gate driver unit may include a respective drive transistor that passes a clock signal to the output terminal of that gate driver unit. In general, it may be desirable for the drive transistor at the IFP row to experience the same amount of stress as drive transistors in other rows. Methods for applying stress to or removing stress from one or more gate driver units for balancing the amount of stress presented to each gate driver unit are provided herein.

In accordance with one suitable arrangement, at least some gate driver units may include an analog control circuit for selectively applying a predetermined voltage to the gate terminal of the drive transistor during the IFP period. As an example, the analog control circuit may be configured to discharge the gate terminal of the drive transistor (e.g., to remove stress from an internal stress node). In this example, the analog control circuit may include a capacitor, a first control transistor that is coupled in series with the capacitor, and a second control transistor that is coupled in series with the first control transistor. The second control transistor may receive control signals that are only asserted during the IFP period. The first control transistor may have a gate terminal that is either coupled to the gate terminal of the drive transistor or coupled to a separate capacitor that stores a constant high voltage during the entirety of the IFP period. As another example, the analog control circuit may be configured to charge the internal stress node. In such example, the control circuit may include a pull-up transistor that pulls up the voltage of the internal stress node at the beginning of the IFP period and a pull-down transistor that pulls down the voltage at the internal stress node at the end of the IFP period.

In accordance with another suitable arrangement, at least some gate driver units may be implemented using digital control circuits that selectively apply a predetermined voltage onto the gate terminal of the drive transistor. The drive transistor may be part of a digital transmission gate and may be referred to herein as a pass transistor. The digital control circuit may be a digital logic gate that is coupled between the pass transistor and a digital circuit latch (e.g., a typical flip-flop or a set-reset latch). The digital logic gate may be a logic NOR gate for forcing the gate terminal of the pass transistor low (e.g., to remove stress from the transmission gate in the gate driver unit at the IFP position) or a logic NAND gate for forcing the gate terminal of the pass transistor high during the IFP interval (e.g., to introduce stress to the transmission gate in gate driver units at non-IFP positions).

In accordance with another suitable arrangement, the gate driver circuitry may include a plurality of gate driver segments, where each gate driver segment in the plurality of gate driver segments includes a series of active gate driver units, a first dummy gate driver unit coupled to a leading (first) active gate driver unit in the series of active gate driver units, and a second dummy gate driver unit coupled to a trailing (last) active gate driver unit in the series of active gate driver units. The gate driver circuitry may also include multiplexing circuitry (e.g., demultiplexing circuitry) for routing a gate start signal to a selected one of the plurality of gate driver segments. For example, the demultiplexing circuitry may include an array of pass transistors and logic gates and may have outputs each of which is coupled to the first dummy gate driver unit in a respective gate driver segment in the plurality of gate driver segments.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

FIG. 6A is a diagram showing gate driver circuitry formed on only one side of a display pixel array in accordance with an embodiment of the present invention.

FIG. 6B is a timing diagram showing how the gate driver circuitry of FIG. 6A may be used to provide IFP capabilities in accordance with an embodiment of the present invention.

FIG. 7A is a diagram showing gate driver circuitry formed on two opposing sides of a display pixel array in accordance with an embodiment of the present invention.

FIG. 7B is a timing diagram showing how the gate driver circuitry of FIG. 7A may be used to provide IFP capabilities in accordance with an embodiment of the present invention.

FIG. 28 is a diagram of illustrative digital gate driver units having set-reset latch circuits and IFP gating logic in accordance with an embodiment of the present invention.

FIG. 29 is a circuit diagram of an illustrative digital gate driver unit of the type shown in FIG. 28 and that exhibits reduced stress in accordance with an embodiment of the present invention.

DETAILED DESCRIPTION

Displays are widely used in electronic devices. For example, displays may be used in computer monitors, laptop computers, media players, cellular telephones and other handheld devices, tablet computers, televisions, and other equipment. Displays may be based on plasma technology, organic-light-emitting-diode technology, liquid crystal structures, etc. Liquid crystal displays are popular because they can exhibit low power consumption and good image quality. Liquid crystal display (LCD) structures are sometimes described herein as an example.

Figure 1:
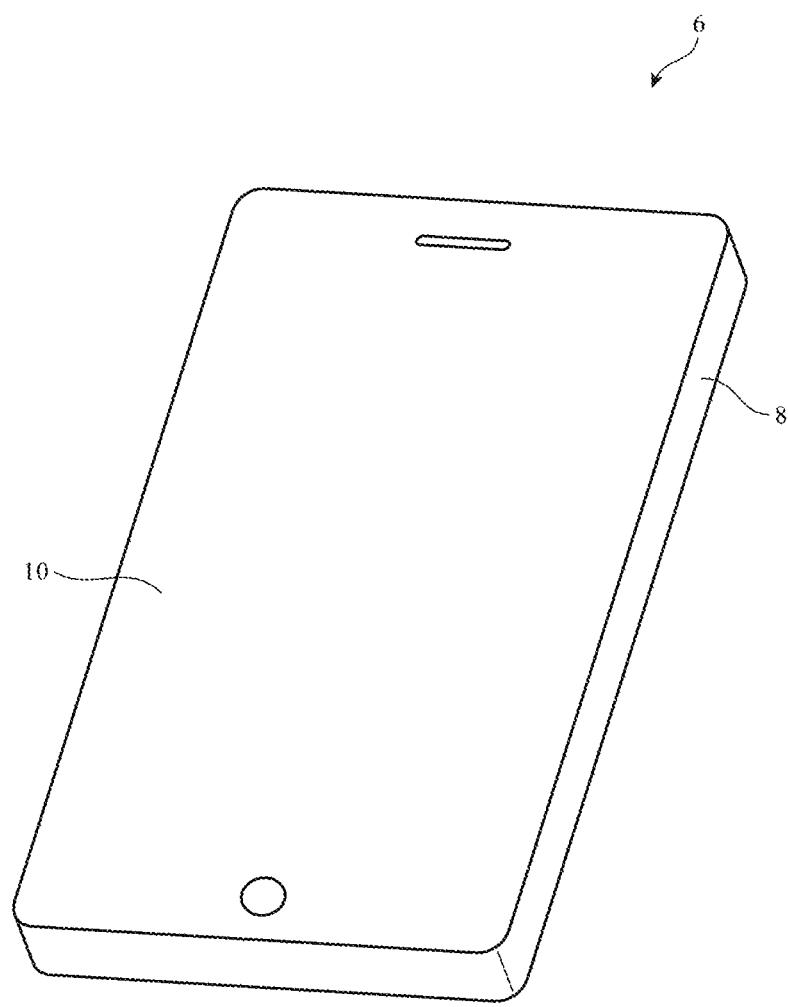
FIG. 1 is a perspective view of an illustrative electronic device having a display such as a liquid crystal display in accordance with an embodiment of the present invention.

A perspective view of an illustrative electronic device with a display is shown in FIG. 1. As shown in FIG. 1, electronic device 6 may have a housing such as housing 8. Housing 8 may be formed from materials such as plastic, glass, ceramic, metal, fiber composites, and combinations of these materials. Housing 8 may have one or more sections. For example, device 6 may be provided with a display housing portion and a base housing portion that are coupled by hinges. In the arrangement of FIG. 1, device 6 has a front face and a rear face. Display 10 of FIG. 1 is mounted on the front face of housing 8. Other configurations may be used if desired.

The illustrative configuration of device 6 in FIG. 1 is merely illustrative. In general, electronic device 6 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Display 10 may be a liquid crystal display. A touch sensor array may be incorporated into display 10 (e.g., to form a touch screen display). The touch sensor may be based on acoustic touch technology, force sensor technology, resistive sensor technology, or other suitable types of touch sensor. With one suitable arrangement, the touch sensor portion of display 10 may be formed using a capacitive touch sensor arrangement. With this type of configuration, display 10 may include a touch sensor array that is formed from rows and columns of capacitive touch sensor electrodes.

Figure 2:
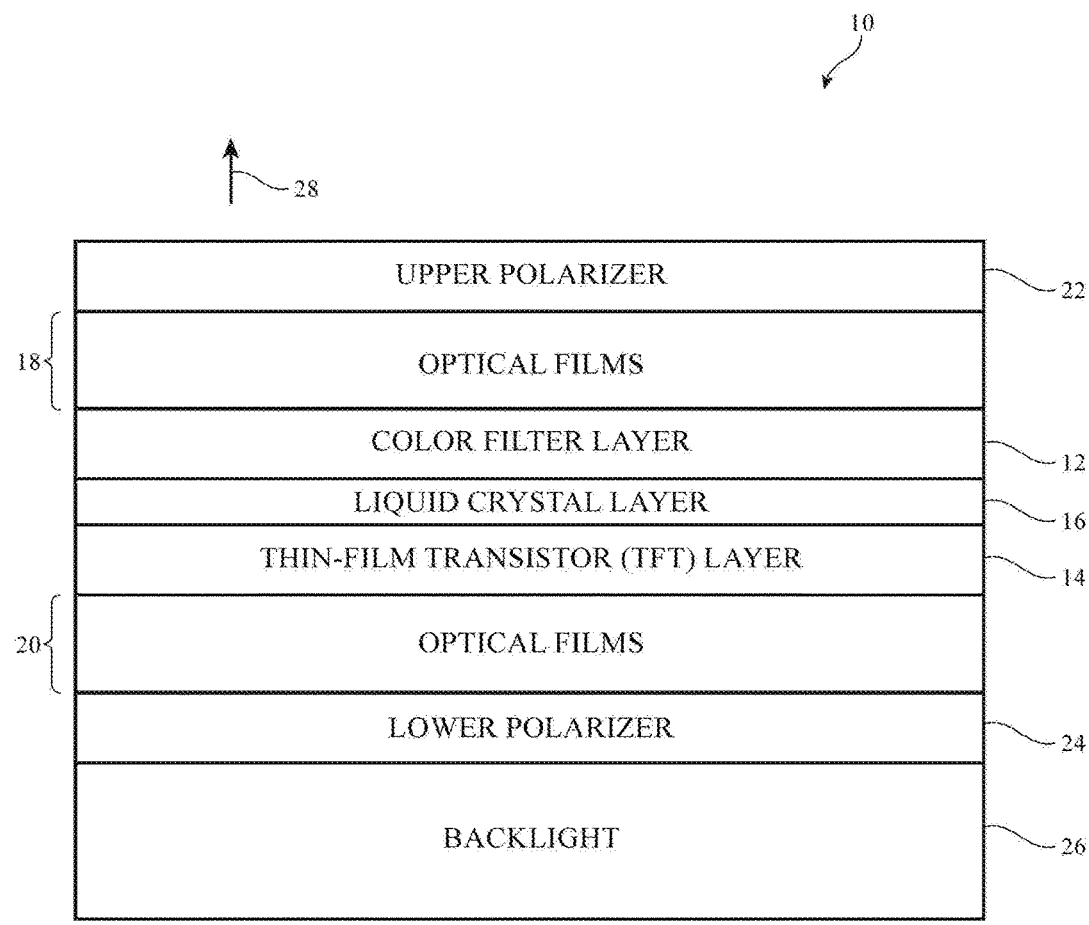
FIG. 2 is cross-sectional side view of an illustrative display in accordance with an embodiment of the present invention.

A cross-sectional side view of a portion of a display of the type that may be used in forming display 10 of FIG. 1 is shown in FIG. 2. As shown in FIG. 2, display 10 may include color filter (CF) layer 12 and thin-film-transistor (TFT) layer 14. Color filter layer 12 may include an array of colored filter elements. In a typical arrangement, the pixels of layer 12 each include three types of colored pixels (e.g., red, green, and blue subpixels). Liquid crystal (LC) layer 16 includes liquid crystal material and is interposed between color filter layer 12 and thin-film-transistor layer 14. Thin-film-transistor layer 14 may include electrical components such as thin film transistors, capacitors, and electrodes for controlling the electric fields that are applied to liquid crystal layer 16. Optical film layers 18 and 20 may be formed above and below color filter layer 12, liquid crystal layer 16, and thin-film-transistor layer 14. Optical films 18 and 20 may include structures such as quarter-wave plates, half-wave plates, diffusing films, optical adhesives, and birefringent compensating layers. In other suitable arrangements, thin-film transistor layer 14 may be formed on top of the liquid crystal material while the color filter layer 12 may be formed below the liquid crystal material.

Display 10 may have upper and lower polarizer layers 22 and 24. Backlight 26 may provide backside illumination for display 10. Backlight 26 may include a light source such as a strip of light-emitting diodes. Backlight 26 may also include a light-guide plate and a back reflector. The back reflector may be located on the lower surface of the light-guide panel to prevent light leakage. Light from the light source may be injected into an edge of the light-guide panel and may scatter upwards in direction 28 through display 10. An optional cover layer such as a layer of coverglass may be used to cover and protect the layers of display 10 that are shown in FIG. 2.

Touch sensor structures may be incorporated into one or more of the layers of display 10. In a typical touch sensor configuration, an array of capacitive touch sensor electrodes may be implemented using pads and/or strips of a transparent conductive material such as indium tin oxide. Other touch technologies may be used if desired (e.g., resistive touch, acoustic touch, optical touch, etc.). Indium tin oxide or other transparent conductive materials or non-transparent conductors may also be used in forming signal lines in display 10 (e.g., structures for conveying data, power, control signals, etc.).

In black and white displays, color filter layer 12 can be omitted. In color displays, color filter layer 12 can be used to impart colors to an array of image pixels. Each image pixel may, for example, have three corresponding liquid crystal diode subpixels. Each subpixel may be associated with a separate color filter element in the color filter array. The color filter elements may, for example, include red (R) color filter elements, blue (B) color filter elements, and green (G) color filter elements. These elements may be arranged in rows and columns. For example, color filter elements can be arranged in stripes across the width of display 10 (e.g., in a repeating patterns such as a RBG pattern or BRG pattern) so that the color filter elements in each column are the same (i.e., so that each column contains all red elements, all blue elements, or all green elements). By controlling the amount of light transmission through each subpixel, a desired colored image can be displayed.

The amount of light transmitted through each subpixel can be controlled using display control circuitry and electrodes. Each subpixel may, for example, be provided with a transparent indium tin oxide electrode. The signal on the subpixel electrode, which controls the electric field through an associated portion of the liquid crystal layer and thereby controls the light transmission for the subpixel, may be applied using a thin film transistor. The thin film transistor may receive data signals from data lines and, when turned on by an associated gate line, may apply the data line signals to the electrode that is associated with that thin-film transistor.

Figure 3:
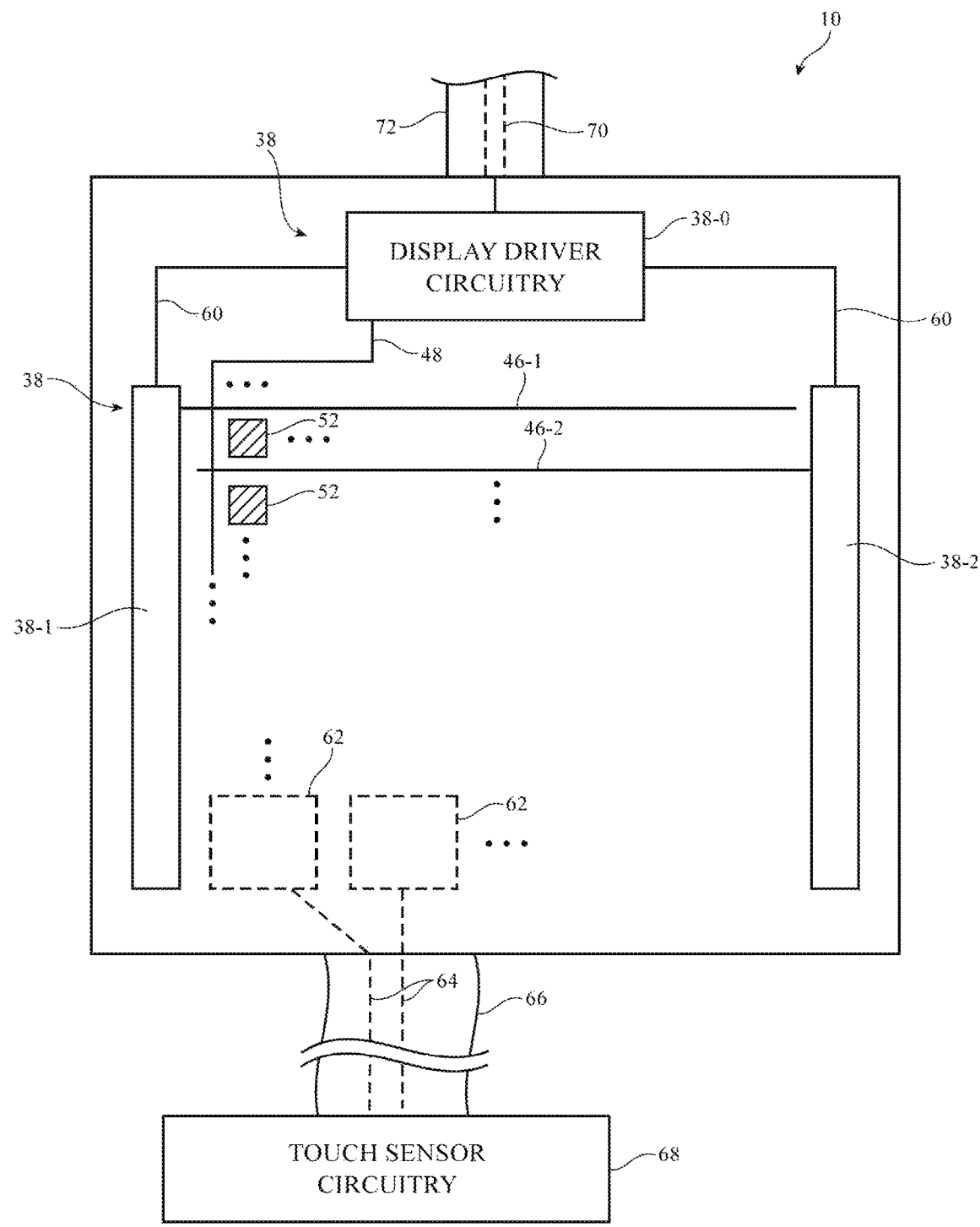
FIG. 3 is an illustrative diagram showing how a display may be provided with image pixel structures and touch sensor elements in accordance with an embodiment of the present invention.

A top view of an illustrative display is shown in FIG. 3. As shown in FIG. 3, display 10 may include an array of image pixels 52. Pixels 52 (which are sometimes referred to as subpixels) may each be formed from electrodes that give rise to an electric field and a portion of liquid crystal layer 16 (FIG. 2) that is controlled by that electric field. Each image pixel may have an electrode that receives a data line signal from an associated transistor and a common electrode. The common electrodes of display 10 may be formed from a layer of patterned indium tin oxide or other conductive planar structures. The patterned indium tin oxide structure or other conductive structures that are used in forming the common plane for image pixels 52 may also be used in forming capacitive touch sensor elements 62.

As illustrated by touch sensor elements 62 of FIG. 3, touch sensor elements (electrodes) may be coupled to touch sensor circuitry 68. Touch sensor elements 62 may include rectangular pads of conductive material, vertical and/or horizontal strips of conductive material, and other conductive structures. Signals from elements 62 may be routed to touch sensor processing circuitry 68 via traces 64 on flex circuit cable 66 or other suitable communications path lines.

In a typical arrangement, there are fewer capacitor electrodes 62 in display 10 than there are image pixels 52, due to the general desire to provide more image resolution than touch sensor resolution. For example, there may be hundreds or thousands of rows and/or columns of pixels 52 in display 10 and only tens or hundreds of rows and/or columns of capacitor electrodes 62.

Display 10 may include display driver circuitry 38. Display driver circuitry 38 may receive image data from processing circuitry in device 6 using conductive lines 70 in path 72. Path 72 may be, for example, a flex circuit cable or other communications path that couples display driver circuitry 38 to integrated circuits on a printed circuit board elsewhere in device 6 (as an example).

Display driver circuitry 38 may include control circuit 38-0, gate line driver circuit 38-1, and gate line driver circuit 38-2. Display driver control circuit 38-0 may be implemented using one or more integrated circuits (e.g., one or more display driver integrated circuits). Circuits 38-1 and 38-2 (sometimes referred to as gate line and Vcom driver circuitry) may be incorporated into control circuit 38-0 or may be implemented using thin-film transistors on layer 14 (FIG. 2). Gate line driver circuits 38-1 and 38-2 implemented using thin-film transistor structures on layer 14 may sometimes be referred to as gate driver on array or "GOA." Paths such as paths 60 may be used to interconnect display driver circuitry 38. Display driver circuitry 38 may also be implemented using external circuits or other combinations of circuitry, if desired.

Display driver circuitry 38 may control the operation of display 10 using a grid of signal lines such as data lines 48, gate lines 46, and Vcom lines (not shown). In the example of FIG. 3, gate driver circuit 38-1 may serve to provide gate line signals to display pixels 52 arranged along even rows in the array (e.g., by supplying gate line signals on even gate lines 46-1), whereas gate driver circuit 38-2 may serve to provide gate line signals to display pixels 52 arranged along odd rows in the array (e.g., by supplying gate line signals on odd gate lines 46-2). This type of interlaced driving scheme in which gate line driver circuits drive signals from two different sides of the array in this way is merely illustrative. In other suitable arrangements, gate drivers may be formed on only one side, or on more than two sides of the image pixel array.

Note that the touch function may be performed during a touch interval portion of the video frame, and in particular during a "blanking" interval (rather than during a display interval) of the video frame. In conventional displays, the touch interval is typically inserted only between successive display intervals that each display an entire image/video frame (i.e., conventional touch screen displays are only configured to implement inter-frame pause for touch sensing).

Figure 4:
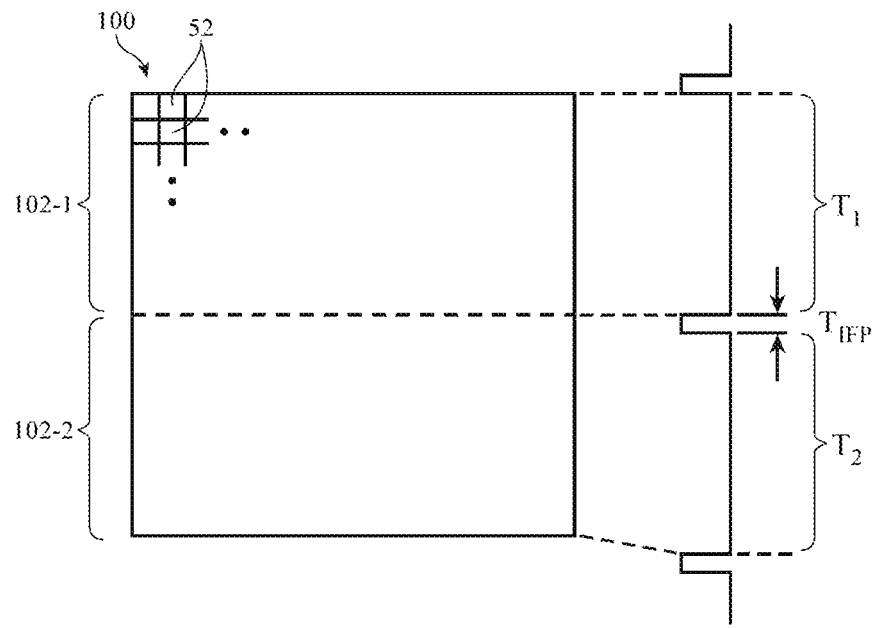
FIG. 4 is a diagram illustrating a single intra-frame pause (IFP) in accordance with an embodiment of the present invention.

In some arrangements, it may be desirable to perform touch sensing at more frequent intervals. In accordance with an embodiment of the present invention, display 10 may be configured to implement an intra-frame pausing (IFP) scheme to allow touch sensing operations to be performed at relatively higher frequencies compared to the inter-frame pausing scheme. FIG. 4 is a diagram showing a single intra-frame pause. As shown in FIG. 4, a display pixel array 100 that includes image pixels 52 arranged in rows and columns may be organized into a first sub-frame 102-1 and a second sub-frame 102-2. First sub-frame 102-1 may be loaded with new display data during time period T1, whereas second sub-frame 102-2 may be loaded with new display data during time period T2. To implement a single IFP, an initial blanking interval may occur prior to loading first sub-frame 102-1 (i.e., immediately prior to period T1), and a single IFP blanking interval may be inserted after loading of first sub-frame 102-1 and prior to loading of second sub-frame 102-2 (i.e., between periods T1 and T2). After the second sub-frame 102-2 has been loaded with new display data, the steps described above may be repeated for the next frame.

Each blanking interval may have a duration $T_{IFP}$ during which touch sensing operations or other display/non-display related operations may be performed. The example of FIG. 4 in which the IFP is inserted at the middle of the frame is merely illustrative. If desired, the position of the IFP may be adjusted (e.g., the intra-frame pause may be inserted more towards the top of the frame or more towards the bottom of the frame). If desired, the duration of each blanking interval can also be adjusted (e.g., period $T_{IFP}$ may be adjusted).

Figure 5:
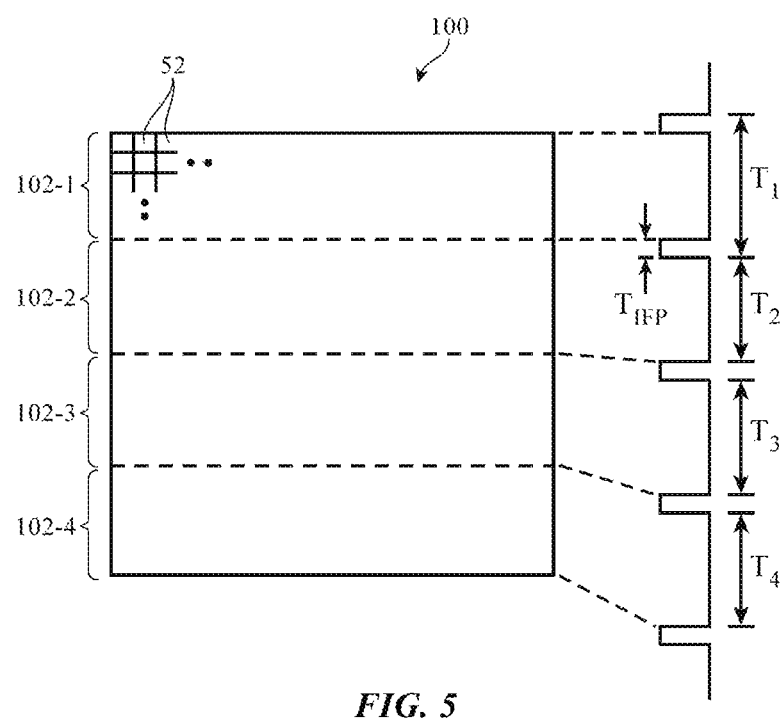
FIG. 5 is a diagram illustrating multiple intra-frame pauses (IFPs) in accordance with an embodiment of the present invention.

In other suitable arrangements, multiple IFPs may be inserted within a single frame (see, FIG. 5). As shown in FIG. 5, display pixel array 100 may be organized into a first sub-frame 102-1, a second sub-frame 102-2, a third sub-frame 102-3, and a fourth sub-frame 102-4, each of which displays data for a quarter of the entire frame. First sub-frame 102-1 may be loaded with new display data during display interval T1; second sub-frame 102-2 may be loaded with new display data during display interval T2; third sub-frame 102-3 may be loaded with new display data during display interval T3; and fourth sub-frame 102-4 may be loaded with new display data during display interval T4. To implement multiple IFPs in this scenario, an initial blanking interval may occur prior to loading first sub-frame 102-1 (i.e., immediately prior to period T1), a first IFP blanking interval may be inserted after accessing sub-frame 102-1 and prior to accessing sub-frame 102-2 (i.e., between periods T1 and T2), a second IFP blanking interval may be inserted after accessing sub-frame 102-2 and prior to accessing sub-frame 102-3 (i.e., between periods T2 and T3), a third IFP blanking interval may be inserted after accessing sub-frame 102-3 and prior to accessing sub-frame 102-4 (i.e., between periods T3 and T4). After the fourth sub-frame 102-4 has been loaded with new display data, the steps described above may be repeated for the next frame.

The example of FIG. 5 in which the IFP is inserted at regular intervals within the frame is merely illustrative. In general, any number of IFPs may be inserted at any suitable location within the frame. If desired, the duration of each blanking interval may be adjusted, and the duration of each IFP blanking interval need not be the same.

FIG. 6A is a diagram of a display having gate line driver circuitry 38 formed on only one side of display pixel array 100. As shown in FIG. 6A, gate line driver circuitry 38 may include a series of gate line driver units connected in a chain. A given gate line driver unit in the chain may be referred to as gate line driver unit "n" that is configured to output a corresponding gate line output signal G(n). The gate line driver unit preceding the given driver unit in the chain may be referred to as gate line driver unit "(n−1)" that is configured to output a corresponding gate line output signal G(n−1). The gate line driver unit following the given driver unit in the chain may be referred to as gate line driver unit "(n+1)" that is configured to output a corresponding gate line output signal G(n+1). Driver units preceding unit (n−1) may be referred to as units (n−2), (n−3), (n−4) . . . , whereas driver units succeeding unit (n+1) may be referred to as units (n+2), (n+3), (n+4), etc.

In the example of FIG. 6A, each gate driver unit has an output that is coupled to an input of a subsequent gate driver unit via a feed-forward path. For example, gate line output G(n−1) may be routed to unit n; gate line output G(n) may be routed to unit (n+1), gate line output G(n+1) may be routed to unit (n+2), etc. Connected in this way, an asserted gate line pulse signal can be propagated down the chain of gate driver units to provide desired raster scanning (e.g., so that new display pixel values can be sequentially written into the display pixel array on a row-by-row basis).

The output of each gate driver unit may also be fed back to a corresponding gate driver unit that is three rows above that gate driver unit. For example, gate line output G(n) may be fed back to unit (n−3), as indicated by feed-back path 190. As another example, gate line output signal G(n−2) may be fed back to unit (n−5), as indicated by path 192. Connected in this way, the output signal of a second gate driver unit subsequent to (but not necessarily immediately following) a first gate driver unit in the chain may be used to "reset" the gate line output signal of the first gate driver unit (e.g., assertion of the output signal generated by the second gate driver unit may drive the output signal of the first gate driver unit low). This is merely exemplary. The output of each gate driver unit may be fed back to any suitable preceding gate driver unit (i.e., the output of a given gate driver unit may be fed back to a corresponding gate driver unit that is less than three rows above the given gate driver unit or more than three rows above the given gate driver unit).

Gate driver circuitry 38 may receive gate clock signals CLKx and an intra-frame pause control signal EN_IFP. Control signal EN_IFP may serve as an enable signal that activates the blanking interval when asserted and that permits the display interval when deasserted. FIG. 6B is a timing diagram that illustrates the behavior of relevant signals during the operation of gate driver circuitry 38 of the type shown in FIG. 6A. As shown in FIG. 6B, active data signals provided on data lines 48 (FIG. 3) may be loaded into corresponding rows in the display pixel array during the display intervals. During the display or "non-blanking" intervals (e.g., when enable signal EN_IFP is deasserted), clock signals CLK1-8 direct the gate driver units to sequentially assert the gate line output signals. The number of clock signals in this example is merely illustrative. In general, any number of clock signals CLKx may be used to control the various gate line driver units.

In the example of FIG. 6B, an intra-frame pause is inserted right after G(n) is asserted. During the IFP blanking interval, enable signal EN_IFP is asserted for a duration $T_{IFP}$. While EN_IFP is asserted, the clock signals CLKx are temporarily suspended, which prevents any gate line signals from being generated (e.g., no display pixels are being accessed during the blanking intervals). At the end of the IFP blanking interval, signal EN_IFP is deasserted, which allows the clock signals to toggle and to continue generating gate line output signals G(n+1), G(n+2), G(n+3), and so no until the next blanking interval.

FIG. 7A is a diagram of a display having gate line driver circuits 38 formed on at least two opposing sides of display pixel array 100. As shown in FIG. 7A, a first gate line driver circuit 38-1 may be formed on a first edge of array 100, whereas a second gate line driver circuit 38-2 may be formed on a second opposing edge of array 100. Each gate line driver circuits 38-1 and 38-2 may include multiple gate line driver units coupled in a chain. Gate line driver circuit 38-1 may include gate line driver units that are used to generate gate line output signals G(n−4), G(n−2), G(n), G(n+2), G(n+4), etc. for "even" pixel rows in the array, whereas 38-2 may include gate line driver units that are used to generate gate line output signals G(n−3), G(n−1), G(n+1), G(n+3), G(n+5), etc. for "odd" pixel rows in the array.

Even row gate driver circuit 38-1 may receive gate clock signals CLKx and an IFP control signal EN_IFP, whereas odd row gate driver circuit 38-2 may receive gate clock signals CLKx' and control signal EN_IFP. The clock signals controlling the gate driver units in circuit 38-1 may be different or may be the same as those controlling the gate driver units in circuit 38-2. Similarly, signal EN_IFP controlling the gate driver units in circuit 38-1 may be the same or may be different than that controlling the gate driver units in circuit 38-2.

FIG. 7B is a timing diagram that illustrates the behavior of relevant signals during the operation of gate driver circuitry 38 of the type shown in FIG. 7A. As shown in FIG. 7B, active data signals provided on data lines 48 (FIG. 3) may be loaded into corresponding rows in the display pixel array during the display intervals. During the display or "non-blanking" intervals (e.g., when enable signal EN_IFP is deasserted), clock signals CLK1-4 may direct the even gate driver units to sequentially assert the gate line output signals while clock signals CLK1a-4a may direct the odd driver units to sequentially assert the gate line output signals. The number of clock signals in this example is merely illustrative. In general, any number of clock signals CLKx may be used to control the various gate line driver units.

In the example of FIG. 7B, the intra-frame pause is inserted after G(n) is asserted by circuit 38-1 and after G(n−1) is asserted by circuit 38-2. During the IFP blanking interval, enable signal EN_IFP is asserted for time period $T_{IFP}$. While EN_IFP is asserted, the clock signals CLK1-4 and CLK1a-4a are temporarily suspended, which prevents any gate line signals from being generated (e.g., no display pixels are being accessed during the blanking intervals). At the end of the IFP blanking interval, signal EN_IFP is deasserted, which allows the clock signals to toggle and to continue generating gate line output signals G(n+1), G(n+2), G(n+3), and so no until the next blanking interval.

Figure 8:
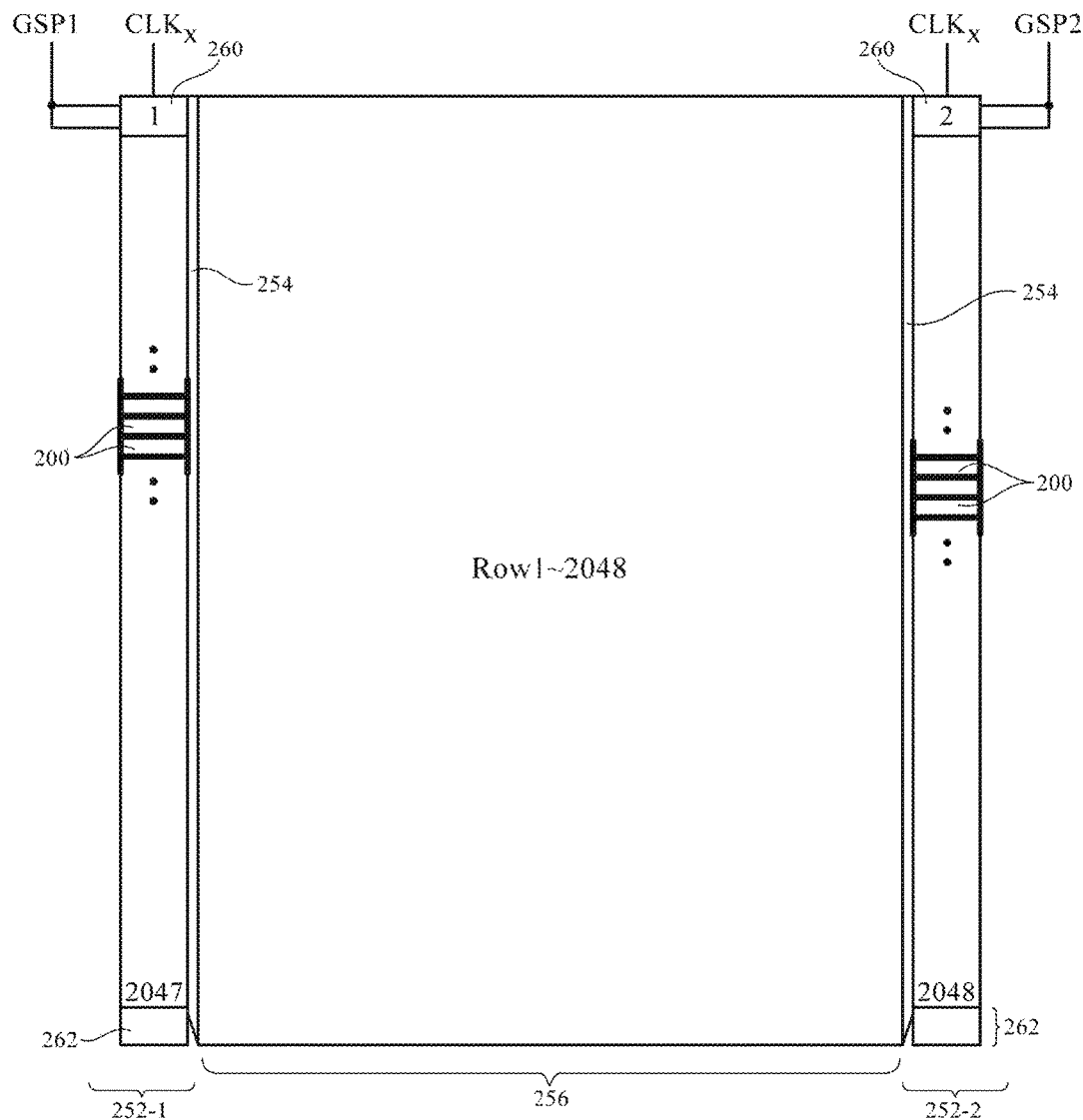
FIG. 8 is a top view of a conventional display element array having a single gate driver chain formed on each of two opposing sides of the array.

FIG. 8 is a diagram of an LCD display pixel array 256 that is coupled to gate driver circuits implemented using conventional gate driver units 200. As shown in FIG. 8, gate driver circuits 252-1 and 252-2 are coupled to array 256 via associated routing circuitry 254. Each gate driver circuit 252 (i.e., circuits 252-1 and 252-2) includes 1024 gate driver units 200 connected in a chain. The 1024 conventional gate driver units 200 in gate driver circuit 252-1 are used to provide gate line output signals to the 1024 odd-numbered rows in array 256, whereas the 1024 conventional gate driver units 200 in gate driver circuit 252-2 are used to provide gate line output signals to the 1024 even-numbered rows in array 256.

In each gate driver circuit 252, a first group of dummy gate driver units 260 are coupled to the top of the chain, and a second group of dummy gate driver units 262 are coupled to the bottom of the chain. These "dummy" gate driver units are not actively coupled to the display pixels in array 256 (i.e., they do not have outputs that are directly connected to the image pixels). Gate driver units 260 may serve as dummy units to properly initialize the active gate driver units 200 (i.e., to send appropriate initialization signals to the leading gate driver units 200 in the chain via the feed forward paths described in connection with FIGS. 6 and 7). Gate driver units 262 may serve as dummy units to properly reset the trailing gate driver units 200 in the chain by sending signals via the feedback paths described in connection with FIGS. 6 and 7. Without units 260, the first few gate driver units 200 won't be properly initialized at the beginning of a given frame. Without units 262, the last few gate driver units 200 won't be properly reset at the end of the given frame.

Each of circuits 252-1 and 252-2 are controlled by respective clock signals CLKx. Gate driver circuit 252-1 is activated by gate start pulse signal GSP1, which triggers the clock signals that are controlling circuit 252-1 to start toggling. Similarly, gate driver circuit 252-2 is activated by gate start pulse signal GSP2, which triggers the clock signals that are controlling circuit 252-2 to start toggling. Gate driver circuitry implemented using this conventional approach may suffer from reliability issues when operated to support one or more intra-frame pauses. For example, at least one driver transistor in gate driver units 200 surrounding the IFP location may be subject to elevated stress levels for a substantially longer period of time relative to gate driver units 200 further away from the IFP position. Subjecting driver transistors to elevated stress levels can result in degraded drive strength of gate driver unit 200 (i.e., stress to thin-film transistors can cause hot carrier degradation, gate bias degradation, and self heating effects), which can cause visible line noise and other undesirable image artifacts near the IFP row position in the display.

Figure 9:
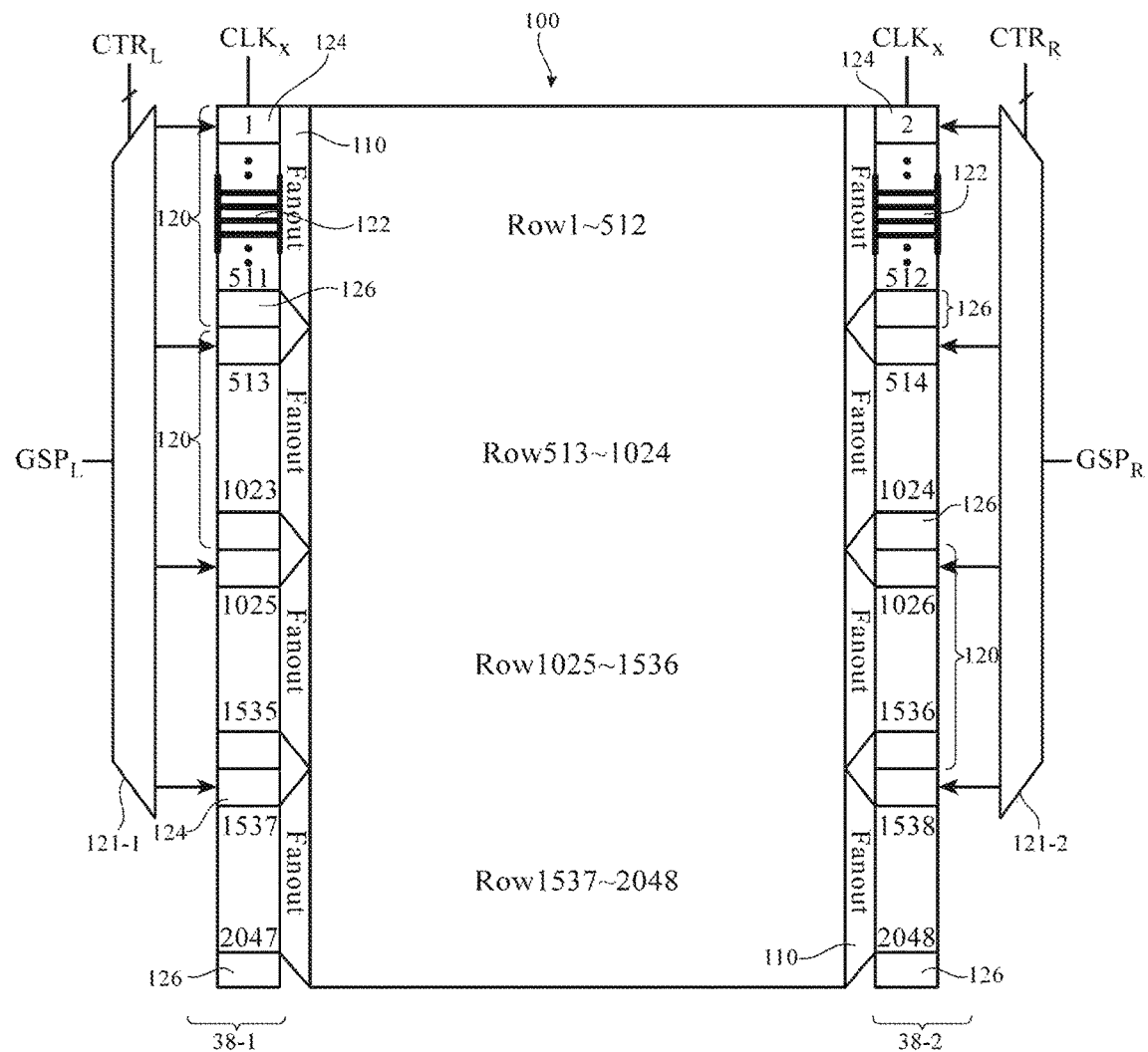
FIG. 9 is a top view of an illustrative display element array having multiplexing circuitry for selectively routing start pulse signals in accordance with an embodiment of the present invention.

In one suitable arrangement, the gate driver circuits may be divided into multiple individual segments, each of which is responsible for driving respective rows in the display pixel array 100. FIG. 9 shows an example where the gate driver circuitry is split on opposing sides of array 100. As shown in FIG. 9, first gate driver circuit 38-1 may be formed on one side of array 100 to drive the odd-numbered rows (e.g., rows 1, 3, 5, . . . , 2047), whereas second gate driver 38-2 may be formed on an opposing side of array 100 to drive the even-number rows (e.g., rows 2, 4, 6, . . . , 2048).

In particular, each of gate driver circuits 38-1 and 38-2 may include multiple gate driver segments 120. Each gate driver segment 120 may include a series of gate driver units 122 (e.g., gate driver units 122 connected in a chain) and associated dummy gate driver units 124 and 126. One or more gate driver units 124 may be formed at the front of each segment 120 and may serve as dummy units for initializing the first few active gate driver units 122 in the chain. One or more gate driver units 126 may be formed at the end of each segment 120 and may serve as dummy units for resetting the last few active gate driver units 122 in the chain. The active gate driver units 122 in each segment 120 may be coupled to corresponding rows in array 100 via routing circuitry 100 (sometimes referred to as "fanout" circuitry), whereas the dummy gate driver units 124 and 126 have outputs that are not actively coupled to array 100. The number of dummy gate driver units 124 and 126 that are required in each gate driver segment 120 may depend on the particular feed-forward and feed-back routing configuration among the active gate driver units (see, FIGS. 7A and 7B).

Each gate driver segment 120 may be separately controlled by a respective gate start pulse signal. In the example of FIG. 9, each gate driver segment 120 in the left gate driver circuit 38-1 may receive a gate start pulse from a first multiplexing circuit 121-1, whereas each gate driver segment 120 in the right gate driver circuit 38-2 may receive a gate start pulse from a second multiplexing circuit 121-2. Multiplexing circuit 121-1 may have an input that receives a gate start pulse signal $GSP_L$, a first output that is coupled to the first segment 120 in circuit 38-1 (e.g., to the dummy gate driver unit 124 in that segment), a second output that is coupled to the second segment 120 in circuit 38-1, a third output that is coupled to the third segment 120 in circuit 38-1, a fourth output that is coupled to the fourth segment 120 in circuit 38-1, and a control input for receiving control signals $CTR_L$ that configure multiplexing circuit 121-1 to route $GSP_L$ to a selected one of its outputs. Similarly, multiplexing circuit 121-2 may have an input that receives a gate start pulse signal $GSP_R$, a first output that is coupled to the first segment 120 in circuit 38-2 (e.g., to the dummy gate driver unit 124 in that segment), a second output that is coupled to the second segment 120 in circuit 38-2, a third output that is coupled to the third segment 120 in circuit 38-2, a fourth output that is coupled to the fourth segment 120 in circuit 38-2, and a control input for receiving control signals $CTR_R$ that configure multiplexing circuit 121-2 to route $GSP_R$ to a selected one of its outputs. Multiplexing circuits 121-1 and 121-2 configured in this way are sometimes referred to as "demultiplexing" circuits.

Figure 10:
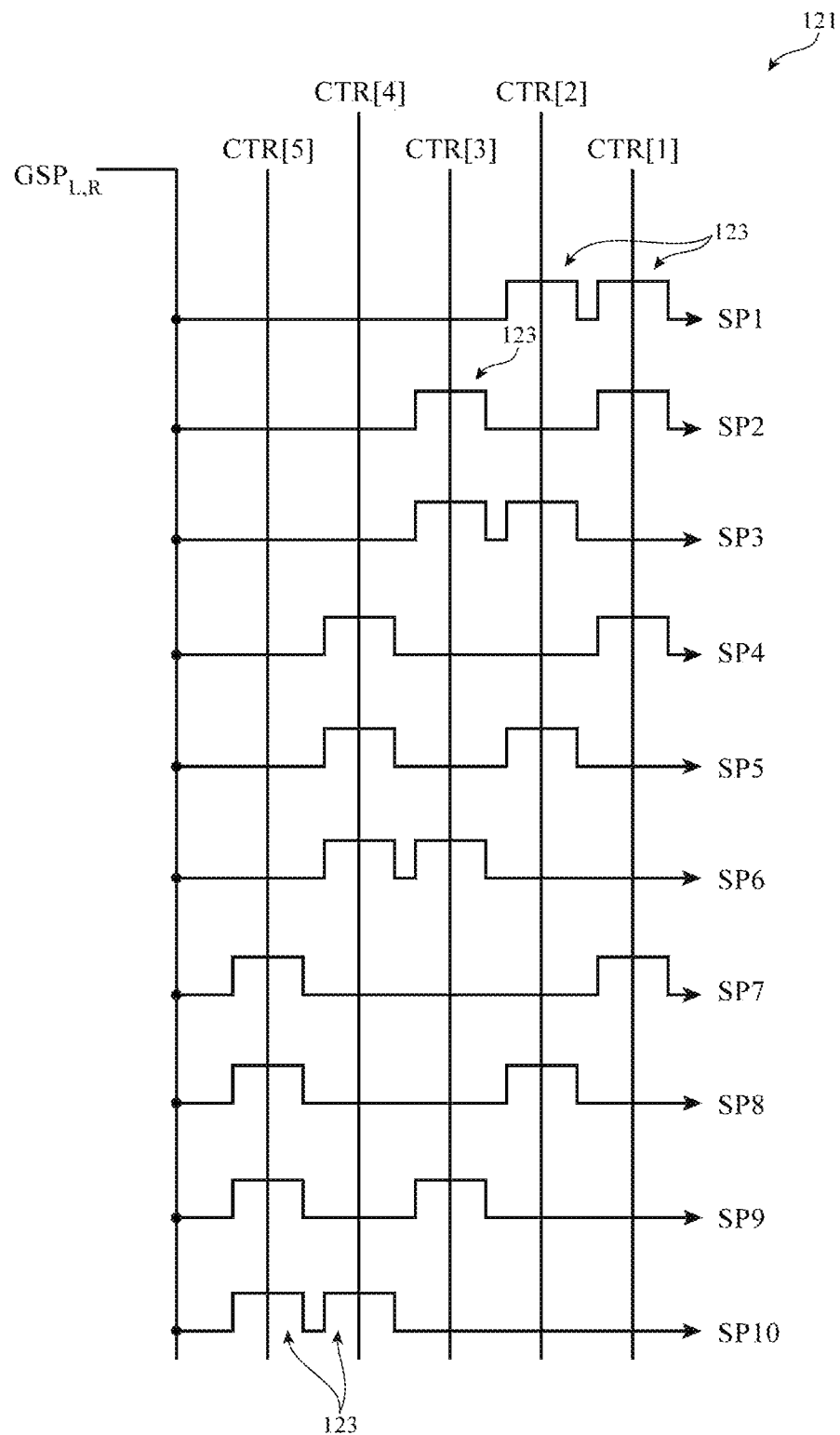
FIG. 10 is a circuit diagram of illustrative multiplexing circuitry of the type shown in FIG. 9 in accordance with an embodiment of the present invention.

FIG. 10 shows one suitable arrangement of a demultiplexing circuit 121. The example of FIG. 10 illustrates a demultiplexing circuit that can be used to control ten gate driver segments 120. As shown in FIG. 10, circuit 121 may include an input for receiving a global gate start pulse signal $GSP_{L,R}$ and pass transistors 123 for selectively passing through the global gate start pulse to one of the output paths. Each pass transistor 123 may receive one of the control signals CTR[5:1]. For example, output signal SP1 that controls the first gate driver segment 120 will only be asserted if control signals CTR[2] and CTR[1] are both high. As another example, output signal SP2 that controls the second gate driver segment 120 will only be asserted if control signals CTR[3] and CTR[1] are both high. As yet another example, output signal SP10 that controls the tenth gate driver segment 120 will only be asserted if control signals CTR]5] and CTR[4] are both high. This particular implementation of demultiplexing circuit 121 is merely illustrative. If desired, demultiplexing circuit 121 may be implemented using logic gates such as logic AND gates, using n-channel or p-channel TFTs, and/or any suitable type of switching circuits. In yet other suitable arrangements, shift register circuitry can be used to provide the gate start pulses to the different gate driver segments.

Connected in this way, the IFP location is fixed. In other words, the IFP may only be inserted at the junction of two adjacent gate driver segments 120. In general, each circuit 38-1 and 38-2 may include any number of gate driver segments 120 for implementing any desired number of IFPs at predetermined row locations in array 100. The duration of each IFP may also be individually adjusted by controlling when the gate start pulses are launched. For example, the first IFP duration between rows 512 and 513 merely can be adjusted by delaying when $GSP_L$ and $GSP_R$ are launched by the desired amount. If desired, a similar multi-segment approach can be implemented for gate driver circuitry that is formed on only one side of array 100 (see, FIGS. 6A and 6B).

Configured in this way, none of the transistors in the active gate driver units 122 will suffer from elevated stress levels since the gate output signals are allowed to freely propagate down the entire chain in each segment 120 without interruption. In other words, no transistor in gate driver units 122 will be subject to a prolonged level of applied stress during IFP intervals since during blanking intervals, any active gate driver unit 122 should have already been reset by dummy units 126, and the IFP interval can be arbitrarily extended by delaying the next gate start pulse.

Figure 11:
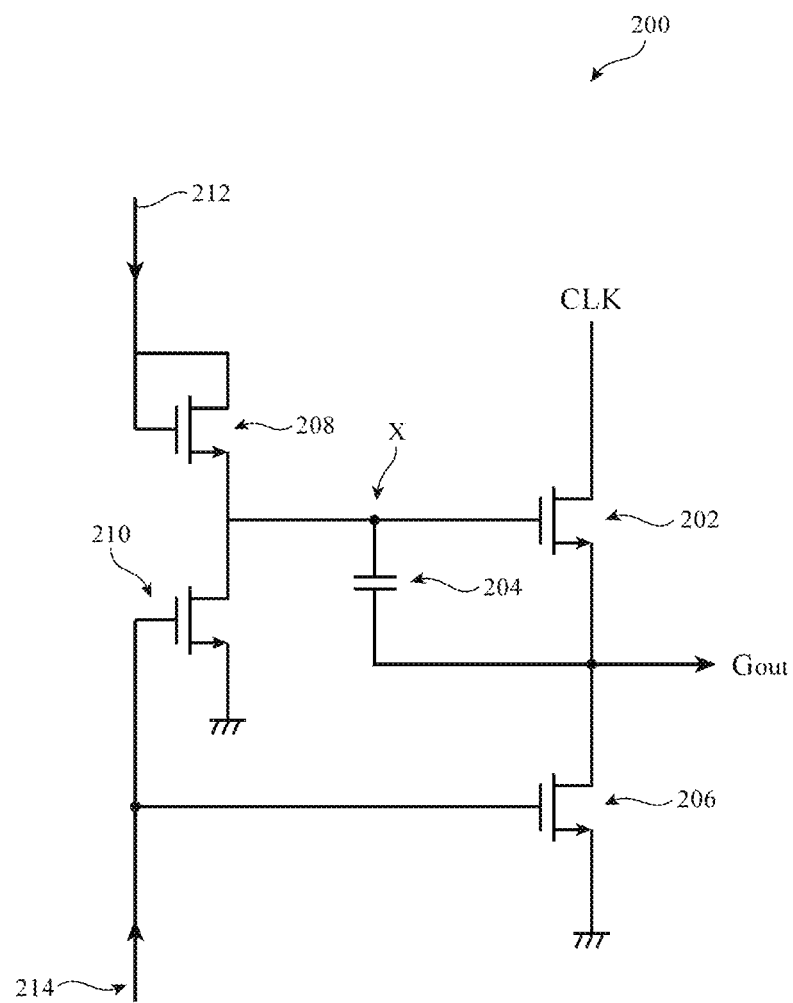
FIG. 11 is a circuit diagram of a conventional gate driver unit.

FIG. 11 is a circuit diagram of a conventional gate line driver unit 200. Gate driver unit 200 includes a capacitor 204 and n-channel thin-film transistors 202, 206, 208, and 210. Transistor 202 has a drain terminal that receives a clock signal CLK, a gate terminal that is connected to an intermediate node X, and a source terminal that is connected to the output of unit 200 (i.e., an output terminal on which Gout is provided). Capacitor 204 has a first terminal that is connected to node X and a second terminal that is connected to the source terminal of transistor 202. Transistor 206 has a drain terminal that is connected to the source terminal of transistor 202, a gate terminal, and a source terminal that is connected to a ground line.

Transistor 208 has a source terminal that is connected to node X, a drain terminal, and a gate terminal that is connected to its drain terminal. Transistor 210 has a drain terminal that is connected to node X, a source terminal that is connected to the ground line, and a gate terminal. The gate and drain terminals of transistor 208 are connected to the gate line output of a preceding gate driver unit via feed-forward path 212, whereas the gate terminals of transistors 206 and 210 are connected to the gate line output of a succeeding gate driver unit via feedback path 214.

Figure 12:
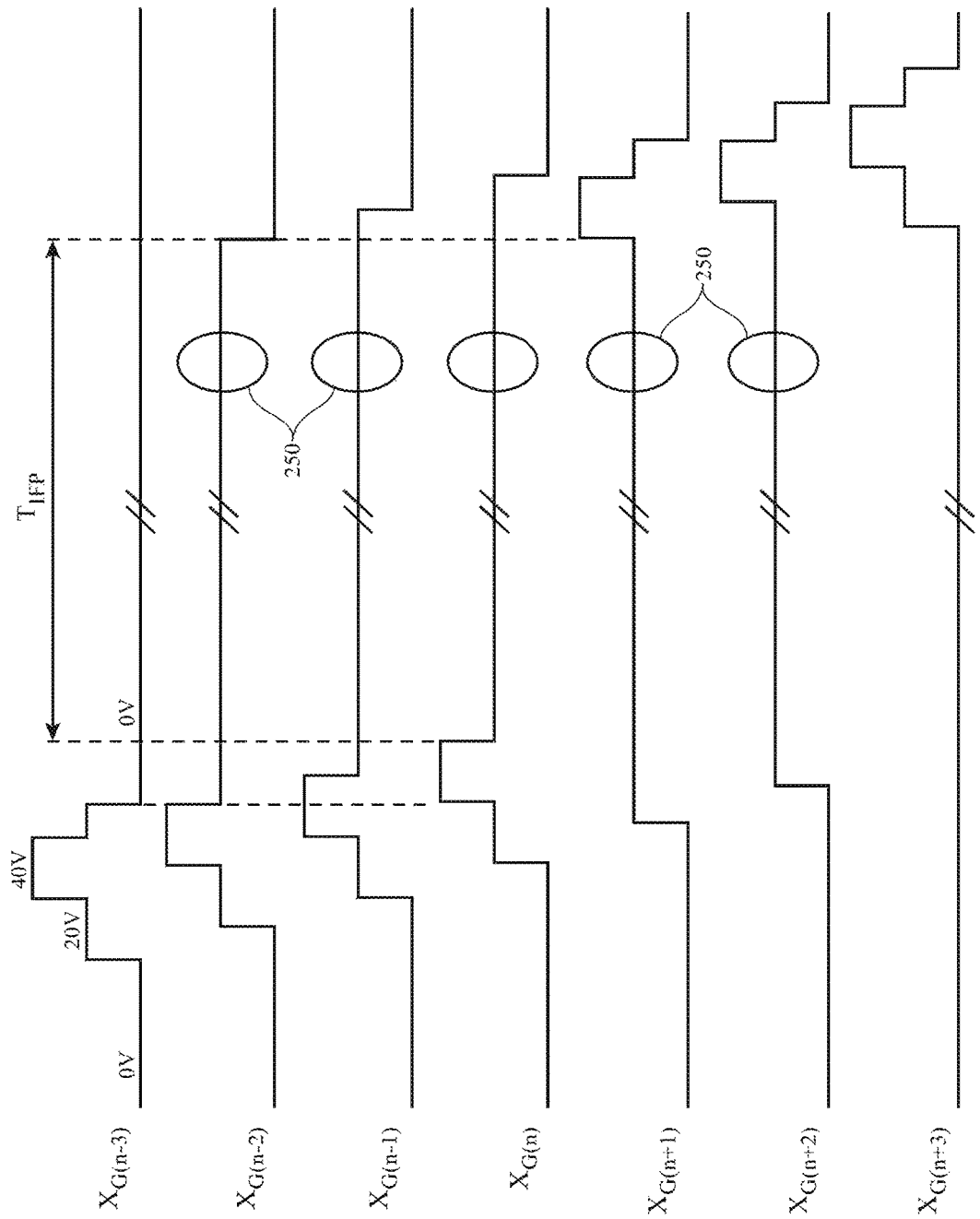
FIG. 12 is a timing diagram illustrating the operation of the conventional gate driver unit of FIG. 11.

FIG. 12 is a timing diagram showing the waveform at node X in a series of conventional gate driver units 200. In particular, consider the voltage $X_{G(n-3)}$ at node X in gate driver unit (n−3). Voltage $X_{G(n-3)}$ may rise from 0 V to 20 V when the gate output from a preceding unit is asserted (i.e., the asserted gate output routed from the preceding unit via path 212 will turn on transistor 208 to pull up $X_{G(n-3)}$). Voltage $X_{G(n-3)}$ may then rise from 20 V to 40 V when the clock signal is asserted (i.e., the incoming clock pulse will enable transistor 202 to pull up $X_{G(n-3)}$). When signal CLK is deasserted, $X_{G(n-3)}$ will fall accordingly back to 20 V. Voltage $X_{G(n-3)}$ is then reset back down to zero volts when the gate output from a succeeding unit is asserted (i.e., the asserted gate output routed from the succeeding unit via path 214 will turn on transistor 210 to pull down $X_{G(n-3)}$).

In this particular scenario, each gate driver unit 200 is reset by a succeeding gate driver unit 200 that is three rows below that gate driver unit. For example, voltage $X_{G(n-2)}$ is only reset to ground when G(n+1) is asserted. When implementing an intra-frame pause in this scenario, it is possible for at least some voltages $X_G$ to be partially asserted during the IFP blanking interval. As indicated by portions 250 in FIG. 12, voltages $X_{G(n-2)}$, $X_{G(n-1)}$, $X_{G(n)}$, $X_{G(n+1)}$, and $X_{G(n+2)}$ may be biased at 20 V for the entirety of the IFP interval assuming the IFP is inserted after G(n) is asserted. As described above, voltage $X_{G(n-2)}$ is only driven back down to zero voltages when G(n+1) is asserted, which can only occur after $T_{IFP}$ since all gate clocking signals are suspending during the blanking interval. Similarly, voltage $X_{G(n-1)}$ is only driven back down to zero voltages when G(n+2) is asserted, which can only occur after $T_{IFP}$. In other words, voltage $X_G$ for gate driver units 200 near the IFP location will be at least partially asserted during the IFP interval.

As illustrated by FIG. 12, node X in gate driver units 200 surrounding the IFP location may be subject to elevated stress levels for a substantially longer period of time relative to gate driver units 200 further away from the IFP position. Node X may therefore sometimes be referred to as the "internal IFP stress node." Subjecting transistor 202 to elevated stress levels can result in degraded drive strength of gate driver unit 200, which can cause image artifacts near the IFP row position and other undesirable reliability issues for the display.

Figure 13:
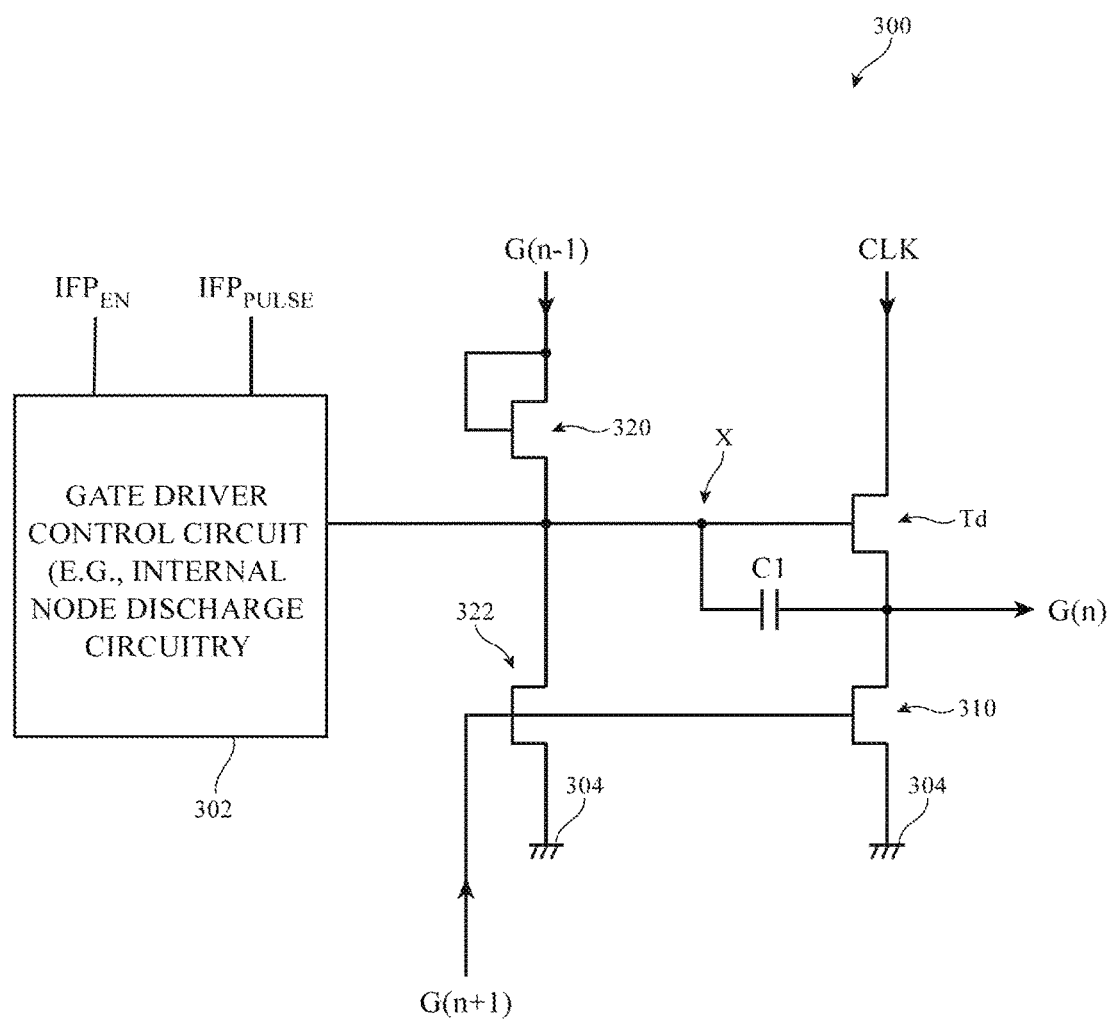
FIG. 13 is a diagram of an illustrative analog gate driver unit that includes internal node discharging circuitry in accordance with an embodiment of the present invention.

In at least one suitable embodiment, a gate driver unit 300 that eliminates the elevated stress levels experienced during an IFP interval is provided. As shown in FIG. 13, gate driver unit 300 may include n-channel thin-film transistors (TFTs) Td, 310, 320, and 304, a capacitor C1, and an associated gate driver control circuit 302. Transistor Td may have a drain terminal that receives a clock signal CLK, a gate terminal that is coupled to an internal node X, and a source terminal that drives the gate driver output signal G(n). Transistor Td is therefore sometimes referred to as the "drive TFT." Capacitor C1 may be coupled between the gate and source terminals of the drive transistor Td.

Transistor 310 may have a drain terminal that is coupled to the source terminal of transistor Td, a gate terminal, and a source terminal that is coupled to ground (i.e., a ground power supply line 304). Transistor 320 may have a drain terminal, a gate terminal that is coupled to its drain terminal, and a source terminal that is coupled to internal node X. Transistor 322 may have a drain terminal that is coupled to internal node X, a gate terminal, and a source terminal that is coupled to ground 304. The drain terminal of transistor 320 may receive signal G(n−1) from a preceding gate driver unit in the chain via a feed-forward path, whereas the gate terminals of transistors 310 and 322 may receive signal G(n+1) from a subsequent gate driver unit in the chain via a feedback path. The example of FIG. 13 in which the gate driver unit 300 receives a feed-forward signal G(n−1) from an immediately preceding gate driver unit and a feedback signal G(n+1) from an immediately succeeding gate driver unit is merely illustrative.

Still referring to FIG. 13, gate driver control circuit 302 may be coupled to the internal node X and may receive control signals $IFP_{EN}$ and $IFP_{PULSE}$. As described in connection with FIG. 12, it is generally not desirable to having node X be partially asserted during IFP intervals. In order to reduce the amount of stress that is experienced by gate driver unit 300, gate driver control circuit 302 may be configured to discharge internal node X during the intra-frame pausing period. By discharging node X during intra-frame pauses, transistor Td in gate driver units 300 at or surrounding the IFP row will no longer experience elevated stress levels. Gate driver control circuit 302 may therefore sometimes be referred to as internal node discharge circuitry.

Figure 14:
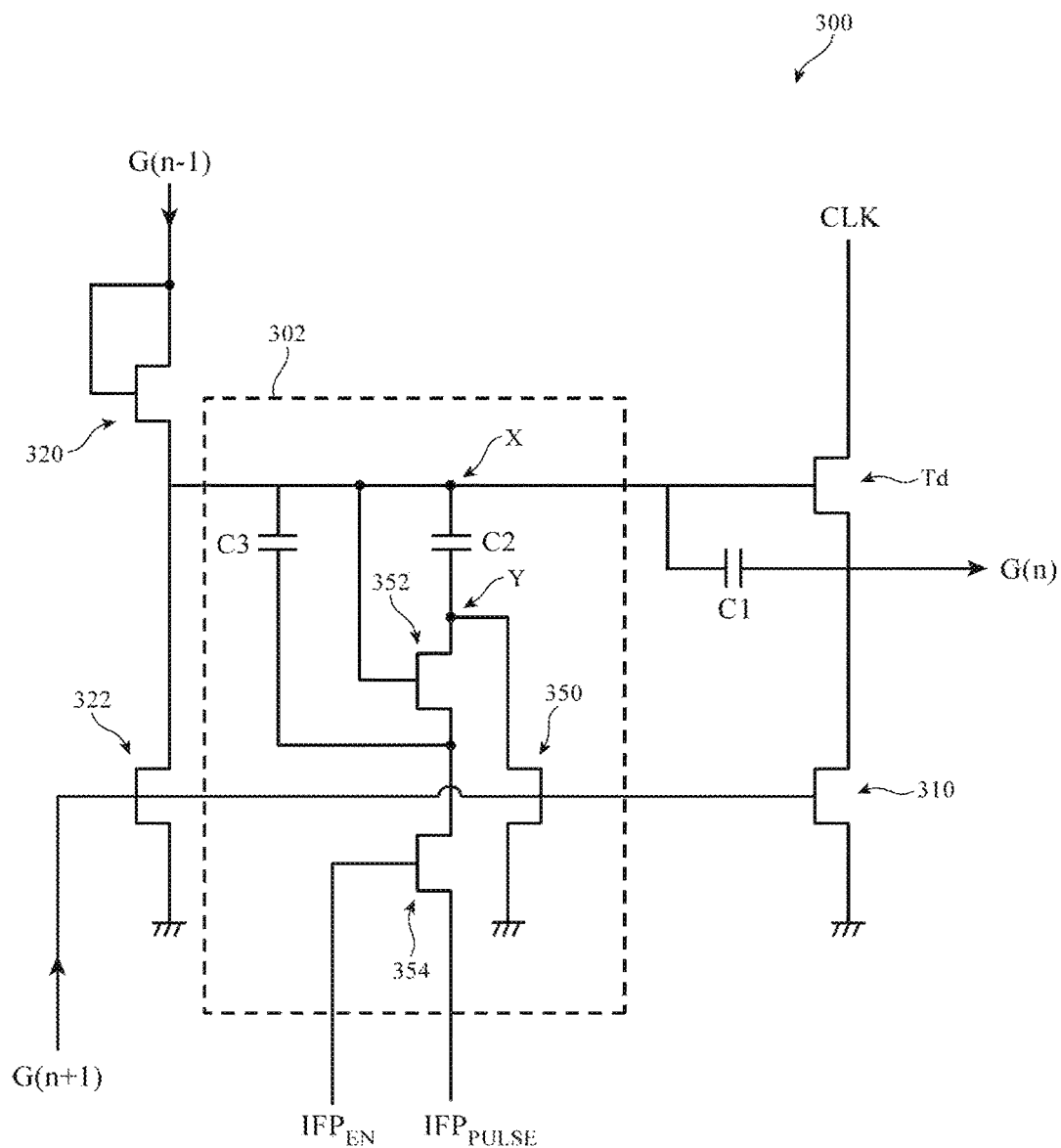
FIG. 14 is a circuit diagram of one implementation of the gate driver unit of FIG. 13 in accordance with an embodiment of the present invention.

FIG. 14 is a circuit diagram of one implementation of gate driver unit 300 of the type shown in FIG. 13. As shown in FIG. 14, gate driver control circuit 302 may include n-channel thin-film transistors 350, 352, and 354 and capacitors C2 and C3. Capacitor C2 may have a first terminal that is coupled to node X and a second terminal that is coupled to another internal node Y. Transistor 350 may have a drain terminal that is coupled to node Y, a gate terminal that is coupled to the gate terminal of transistor 310, and a source terminal that is coupled to ground. Transistor 352 may have a drain terminal that is coupled to node Y, a gate terminal that is coupled to node X, and a source terminal. Capacitor C3 may have a first terminal that is coupled to node X and a second terminal that is coupled to the source terminal of transistor 352. Transistor 354 may have a drain terminal that is coupled to the source terminal of transistor 352, a gate terminal that receives control signal $IFP_{EN}$, and a source terminal that receives control signal $IFP_{PULSE}$.

Figure 15:
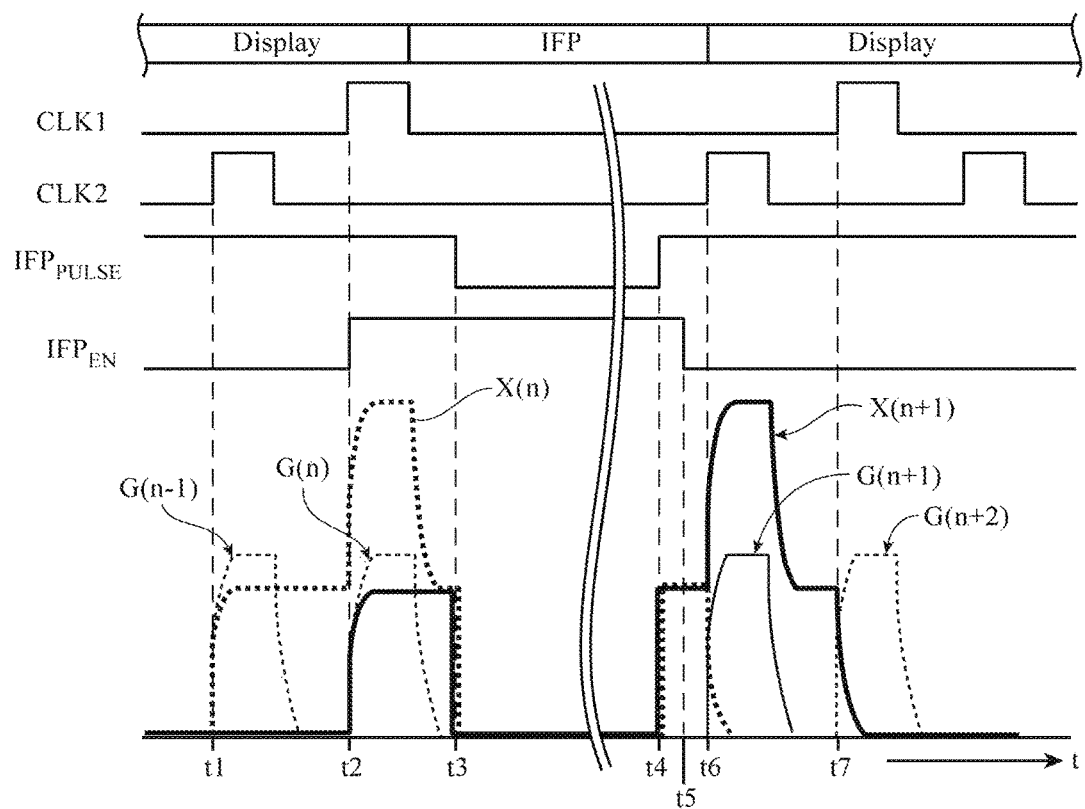
FIG. 15 is a timing diagram that illustrates the operation of the gate driver unit of FIG. 14 in accordance with an embodiment of the present invention.

FIG. 15 is a timing diagram that illustrates the operation of gate driver unit 300 of FIG. 14. At time t1, clock signal CLK2 may be pulsed high during the display interval, which causes output signal G(n−1) at the output of gate driver unit (n−1) to be driven high for the duration of the CLK2 pulse. Assuming the chain of gate driver units 300 uses the feed-forward routing as shown in FIG. 14, the assertion of G(n−1) may turn on transistor 320 in the succeeding gate driver unit (n), which may result in the partial assertion of internal node voltage X(n) in the succeeding gate driver unit (n). While G(n−1) is asserted, capacitor C1 in gate driver unit (n) may be charged up to store the voltage as seen on node X in that gate driver unit. Voltage X(n) may remain asserted until it is actively driven back down to ground using one of transistors 322, 350, and/or 354 in gate driver unit (n).

At time t2, clock signal CLK1 may be pulsed high during the display interval, which causes output signal G(n) at the output of gate driver unit (n) to be driven high for the duration of the CLK1 clock pulse. At the rising edge of CLK1, transistor Td in gate driver unit (n) may charge up its source terminal accordingly. Since the voltage on capacitor C1 has nowhere to discharge at this time, voltage X(n) may be temporarily boosted by the amount of voltage change seen at the source terminal of transistor Td. Capacitor C1 operated in this way is sometimes referred to as a "bootstrapping" capacitor. Assuming the chain of gate driver units 300 uses the feed-forward routing as shown in FIG. 14, the assertion of G(n) may turn on transistor 320 in the succeeding gate driver unit (n+1), which may result in the partial assertion of internal node voltage X(n+1) in the succeeding gate driver unit (n+1). While G(n) is asserted, capacitor C1 in gate driver unit (n+1) may be charged up to store the voltage as seen on node X in that gate driver unit.

In preparation of the upcoming intra-frame pause, controls signal $IFP_{EN}$ may be asserted around time t2. As shown in FIG. 15, control signal $IFP_{PULSE}$ may be nominally asserted (e.g., signal $IFP_{PULSE}$ may be driven high during display intervals and may only be driven low during IFP intervals). At time t2, $IFP_{PULSE}$ may still be driven high. Asserting signal $IFP_{EN}$ while $IFP_{PULSE}$ is driven high may turn on transistor 354 and charge up the source terminal of transistor 352 towards a logic one. This may result in node Y being charged towards logic one in gate driver units having node X at least partially driven high (i.e., in gate driver units (n) and (n+1) in this example), since transistor 352 will be turned on for these gate driver units. Prior to time t3, there may be minimal voltage drop across capacitor C2.

At time t3, control signal $IFP_{PULSE}$ is driven low. Doing so turns transistor 354 into a pull-down transistor, which drives the source terminal of transistor 354 towards logic zero. Meanwhile, transistor 352 may gradually discharge node Y. Since the voltage on capacitor C2 has nowhere to discharge, node X will be pulled down accordingly (see, FIG. 15, voltages X(n) and X(n+1) drop to ground at time t3). When the internal node voltage X falls below a predetermined threshold, transistor 352 may be turned off. Capacitor C3 may serve as an auxiliary coupling capacitor for helping node X fall by the desired amount. Operated in this way, the internal node voltages X(n) and X(n+1) for both gate driver units have successfully been driven down to ground during the entirety of the IFP period, thereby eliminating or at least reducing the stress experienced by one or more transistors Td in the chain of gate driver units.

At time t4, control signal $IFP_{PULSE}$ is driven back high. Doing so may result in transistor 354 charging up the source terminal of transistor 352 towards logic one. The coupling capacitor C3 may then push node X above the ground level so as to at least activate transistor 352. When transistor 352 is turned back on, transistor 352 will charge node Y back up high, which will restore the internal storage node voltages X(n) and X(n+1) to their pre-IFP levels via the use of capacitor C2. Capacitor C2 operated in this way may therefore serve effectively as a storage capacitor for temporarily memorizing the voltage at the internal node X. In general, the capacitance of C2 should be greater than the capacitance of C1 to ensure that the voltage of node X can be accurately restored. The capacitance of coupling capacitor C3 may be less than the capacitance of C1 to save area.

At time t5, control signal $IFP_{EN}$ may be deasserted to turn off transistor 354, indicating the end of the IFP period. At time t6, signal CLK2 may resume clocking to assert output signal G(n+1). In particular, the assertion of G(n+1) may serve to reset the internal nodes of the preceding gate driver unit (e.g., by turning on transistor 322 to discharge node X, by turning on transistor 350 to discharge node Y, and by turning on transistor 310 to discharge capacitor C1) via the use of the feedback path described in connection with FIG. 14. At time t7, signal CLK1 may resume clocking to assert output signal G(n+2) to reset the internal nodes of the preceding gate driver unit (see, voltage X(n+1) is driven back down to ground). Processing may continue in this way to display the remaining portion of the image/video frame.

The example of FIGS. 14 and 15 in which the feed-forward paths are routed from one gate driver unit to an immediately succeeding gate driver unit and in which the feedback paths are routed from one gate driver unit to an immediately preceding gate driver unit is merely illustrative and does not serve to limit the scope of the present invention. If desired, the internal node discharge scheme described in connection with FIGS. 14 and 15 may be extended to reduce the stress of the drive transistor Td during intra-frame pauses for gate driver chains having any suitable feed-forward and feedback routing configuration.

Figure 16:
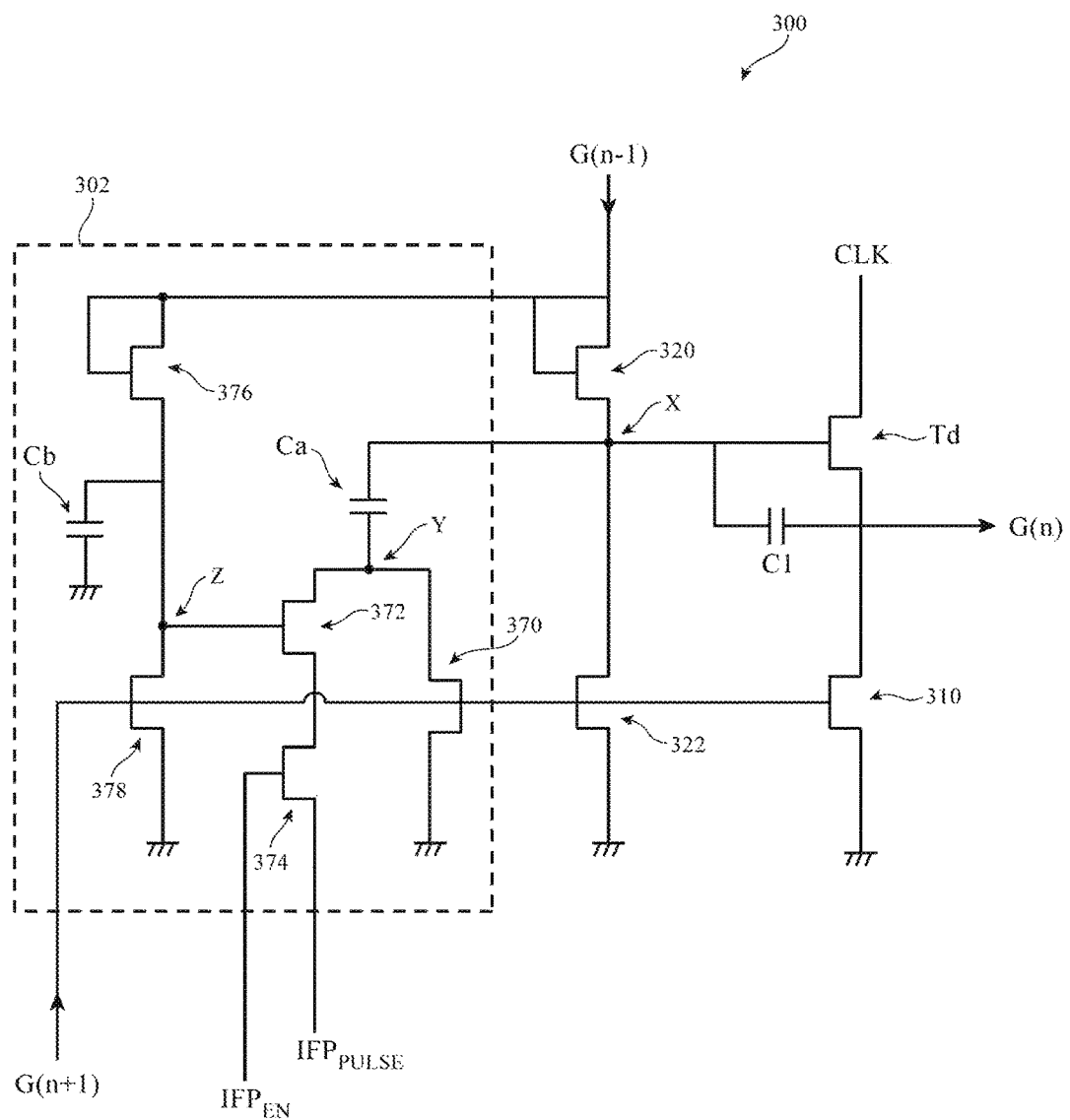
FIG. 16 is a circuit diagram of another implementation of the gate driver unit of FIG. 13 in accordance with an embodiment of the present invention.

In the arrangement of FIG. 14, transistor 352 turns off when node X falls below a predetermined threshold. When transistor 352 is turned off, node Y may not be pulled completely down to ground, which can result in node X not being pulled all the way down. FIG. 16 shows another suitable arrangement of gate driver unit 300 that ensures node Y is completely pulled down during an IFP period.

As shown in FIG. 16, gate driver control circuit 302 may include n-channel thin-film transistors 370, 372, 374, 376, and 378 and capacitors Ca and Cb. Capacitor Cb may have a first terminal that is coupled to internal node X and a second terminal that is coupled to another internal node Y. Transistor 370 may have a drain terminal that is coupled to node Y, a gate terminal that is coupled to the gate terminal of transistor 310, and a source terminal that is coupled to ground. Transistor 372 may have a drain terminal that is coupled to node Y, a gate terminal that is coupled to yet another internal node Z, and a source terminal. Capacitor C3 may have a first terminal that is coupled to node Z and a second terminal that is coupled to ground. Transistor 374 may have a drain terminal that is coupled to the source terminal of transistor 372, a gate terminal that receives control signal $IFP_{EN}$, and a source terminal that receives control signal $IFP_{PULSE}$. Transistor 376 may have a source terminal that is coupled to node Z and drain and gate terminals that are coupled to the gate terminal of transistor 320 (e.g., drain and gate terminals that are coupled to the feed-forward path). Transistor 378 may have a drain terminal that is coupled to node Z, a gate terminal that is coupled to the gate terminal of transistor 310 (e.g., a gate terminal that is coupled to the feedback path), and a source terminal that is coupled to ground.

Figure 17:
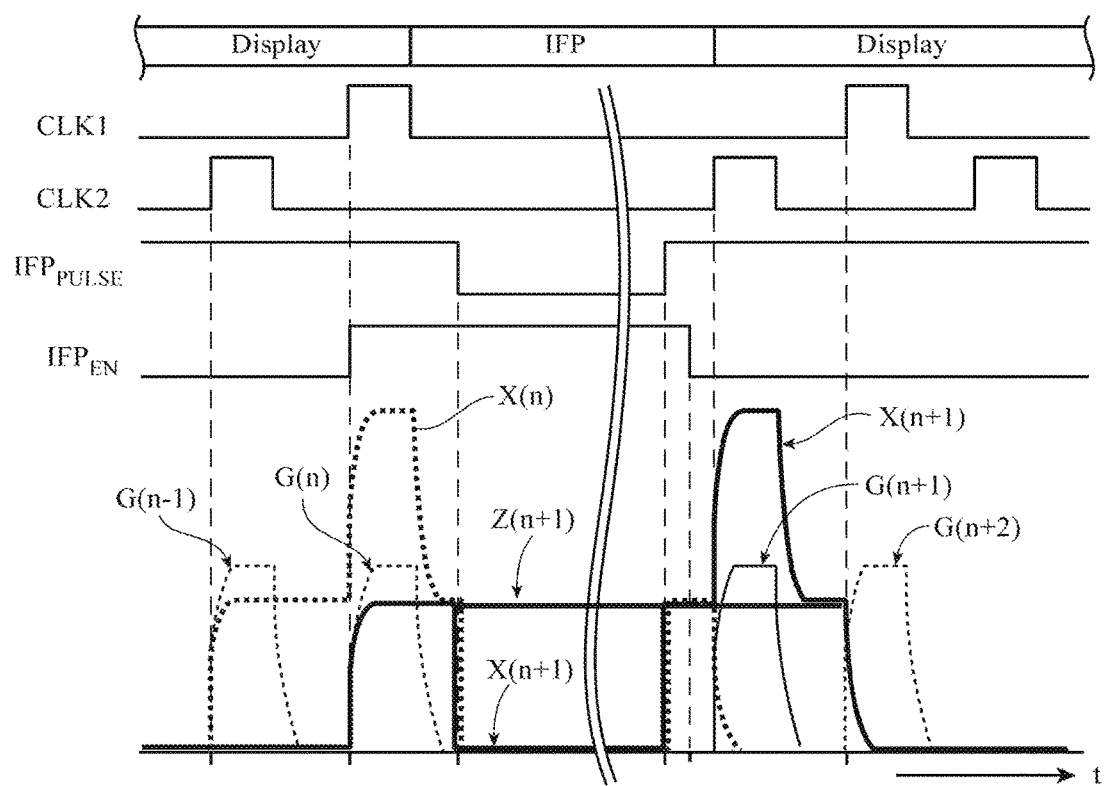
FIG. 17 is a timing diagram that illustrates the operation of the gate driver unit of FIG. 16 in accordance with an embodiment of the present invention.

Configured in this way, capacitor Cb may serve to store an asserted voltage signal during the IFP duration so that transistor 372 remains on during the intra-frame pause. FIG. 17 is a timing diagram illustrating the operation of such type of gate driver unit, where voltage Z(n+1) remains asserted during the IFP interval. Capacitor Cb may be charged up when the gate output signal from a preceding gate driver unit is asserted (e.g., via the feed-forward path routed to transistor 376) and may be discharged when the gate output signal from a succeeding gate driver unit is asserted (e.g., via the feedback path routed to transistor 378). Controlled as such, the assertion and deassertion of internal node Z may be synchronized with the assertion and deassertion of node X. Having node Z kept high ensures that the pull-down path exhibits low resistance during the entirety of the IFP period, which helps to drive node X completely down to ground.

Figure 18:
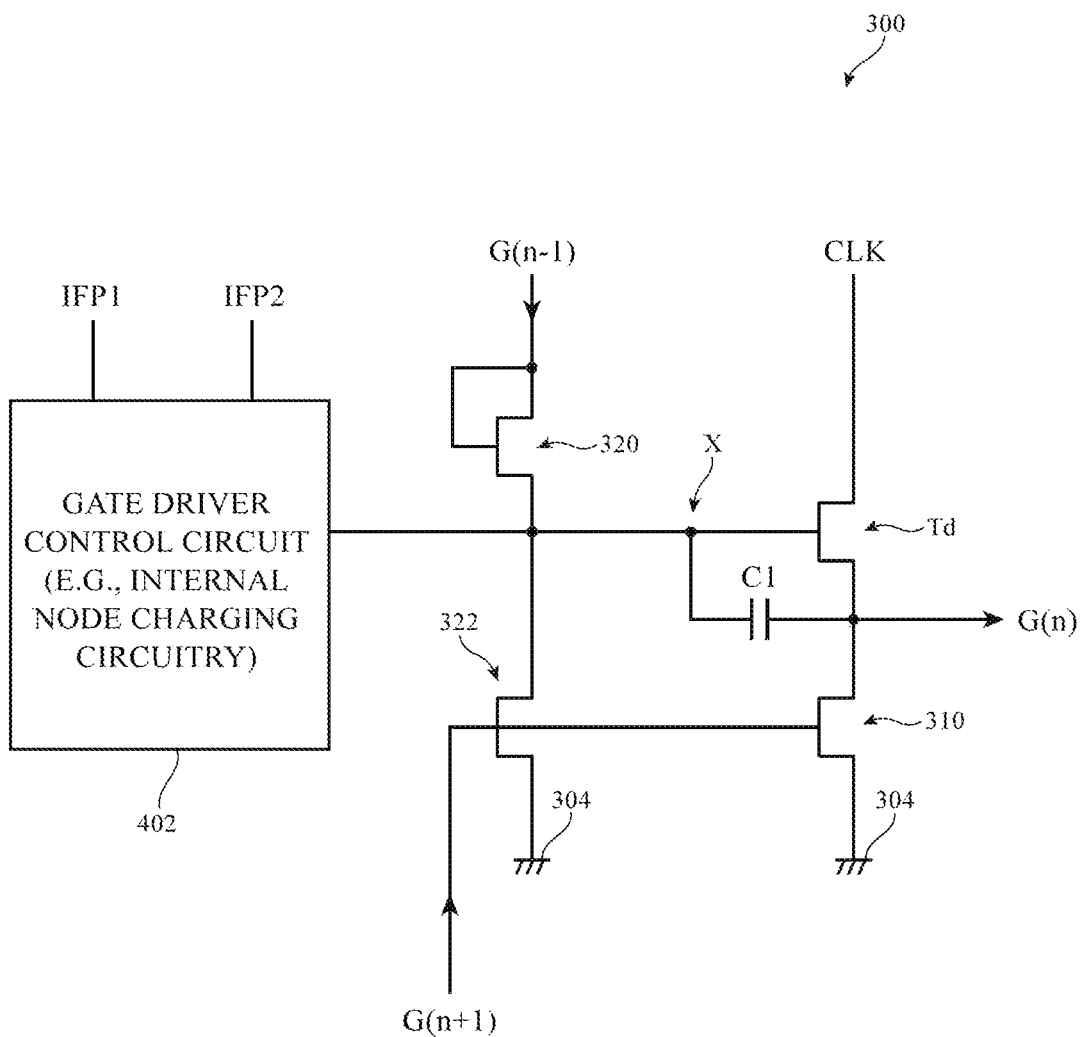
FIG. 18 is a diagram of an illustrative analog gate driver unit that includes internal node charging circuitry in accordance with an embodiment of the present invention.

Gate control circuit 302 of the type described in connection with FIG. 13-17 are configured to discharge the internal nodes X so that the gate driver units around the IFP row do not experience elevated stress levels. In another suitable embodiment, it is possible to charge the internal nodes X of gate driver units that do not experience elevated stress levels during an IFP interval so as to balance the stress among all the gate driver units in the gate driver chain. FIG. 18 is a diagram of gate driver unit 300 that includes a gate driver control circuit 402 that charges the internal node X for that gate driver unit. As shown in FIG. 18, gate driver control circuit 402 may be coupled to the internal node X and may receive control signals IFP1 and IFP2.

Figure 19:
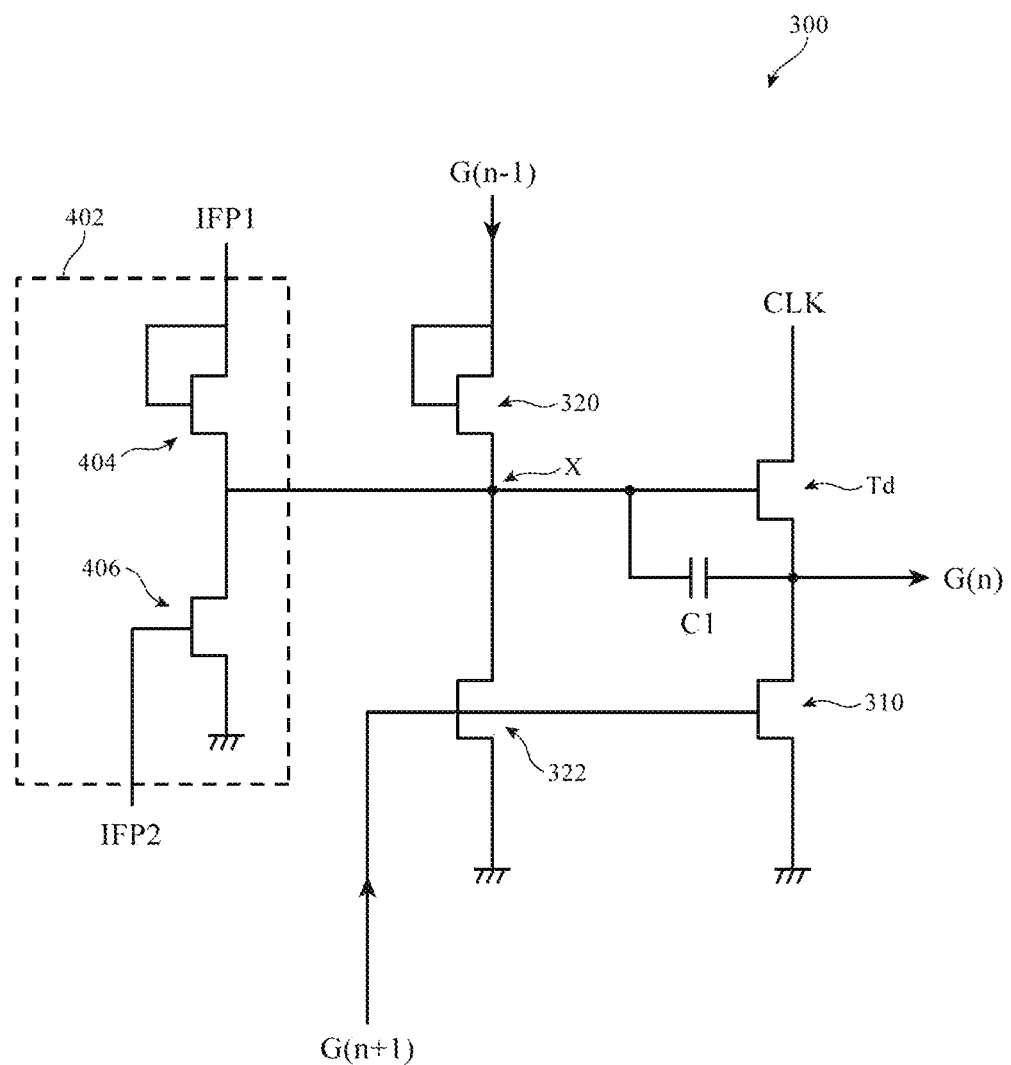
FIG. 19 is a circuit diagram of one implementation of the gate driver unit of FIG. 18 in accordance with an embodiment of the present invention.

FIG. 19 is a circuit diagram of one implementation of gate driver unit 300 of the type shown in FIG. 18. As shown in FIG. 19, gate driver control circuit 402 may include n-channel thin-film transistors 404 and 404. Transistor 404 may have a source terminal that is coupled to node X and gate and drain terminals that receive signal IFP1. Transistor 404 may have a drain terminal that is coupled to node X, a source terminal that is coupled to ground, and a gate terminal that receives control signal IFP2. Only one of control signals IFP1 and IFP2 may be asserted at any given point in time. When signal IFP1 is asserted, transistor 404 may be turned on to pull node X high. When signal IFP2 is asserted, transistor 406 may be turned on to pull node X low. This is merely illustrative. In general, other ways of driving internal node X high/low may be implemented.

Figure 20:
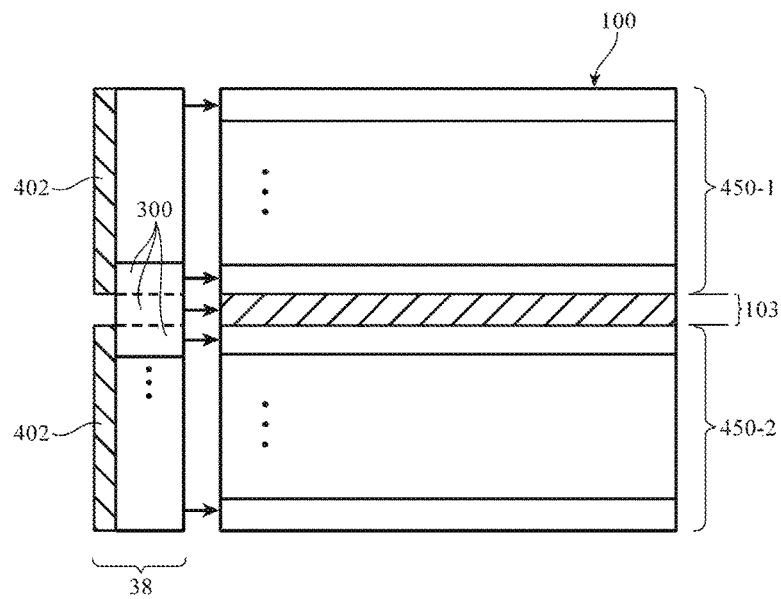
FIG. 20 is a top view showing how gate driver units with internal node charging circuitry may be formed at non-IFP rows in a display element array in accordance with an embodiment of the present invention.

FIG. 20 is a diagram showing how internal node charging circuitry 402 may only be included in gate driver units 300 in non-IFP rows. As shown in FIG. 20, a first group of display elements 450-1 may be separated from a second group of display elements 450-2 by a row of display elements 103 at the IFP row. Display elements 450-1 and 450-2 may be considered to be in non-IFP rows. The gate driver unit 300 corresponding to the IFP row need not include gate driver control circuit 402, since the internal node X in that gate driver unit will already be driven high by a preceding gate output signal. The gate driver units 300 in the non-IFP rows should, however, include a gate driver control circuit 402 for asserting node X for balancing the stress that is experienced by all the gate driver units 300 in gate driver circuit 38.

Figure 21:
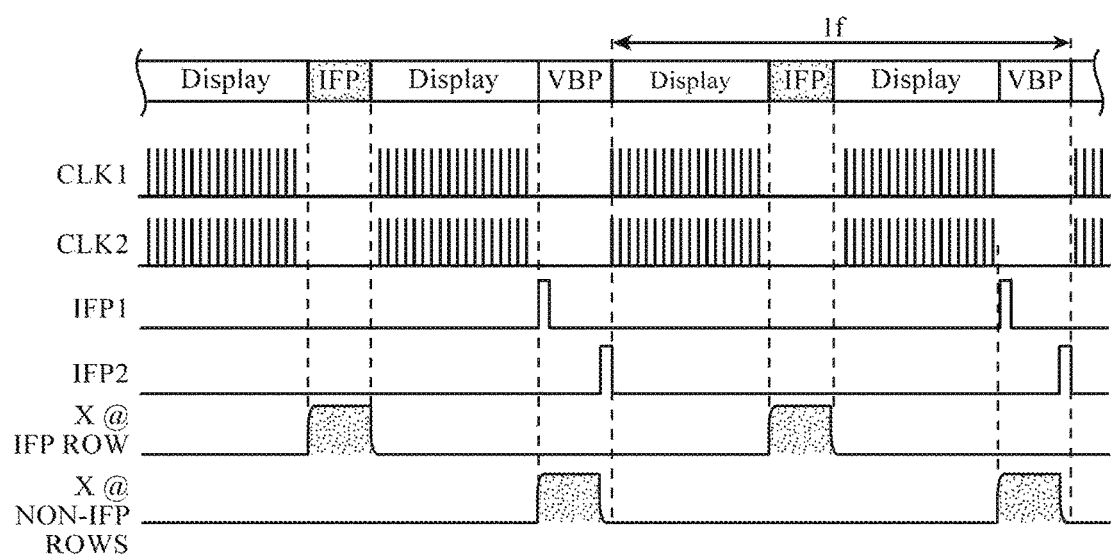
FIG. 21 is a timing diagram that illustrates the operation of the display element array of FIG. 20 in accordance with an embodiment of the present invention.

FIG. 21 is a timing diagram that shows how gate driver control unit 402 may be operated. As shown in FIG. 21, the internal node X in the gate driver unit(s) at or near the IFP row may be high during the IFP period, whereas the internal node X in the remaining gate driver units (i.e., the "non-IFP-disturbed" rows) may be asserted during a separate vertical blanking period (VBP) that is inserted between each successive frame. The assertion of node X in the non-IFP rows may be provided using the internal node charging circuit 402 of the type described in connection with FIG. 19 (as an example). Control signal IFP1 may be pulsed high at the beginning of the vertical blanking interval to charge up the internal nodes X, whereas signal IFP2 may be pulsed high at the end of the vertical blanking interval to discharge the internal nodes X. In general, the time period between the IFP1 pulse and the IFP2 pulse in each vertical blanking period should be substantially similar to the IFP interval to ensure that each gate driver unit is subject to the same amount of stress during each display frame.

The gate driver units 300 of the type described in connection with FIGS. 13-21 having bootstrapping capacitors are sometimes referred to as "analog" gate driver units. In yet other suitable embodiments, "digital" gate driver units that include digital logic gates and circuits may be used.

Figure 22:
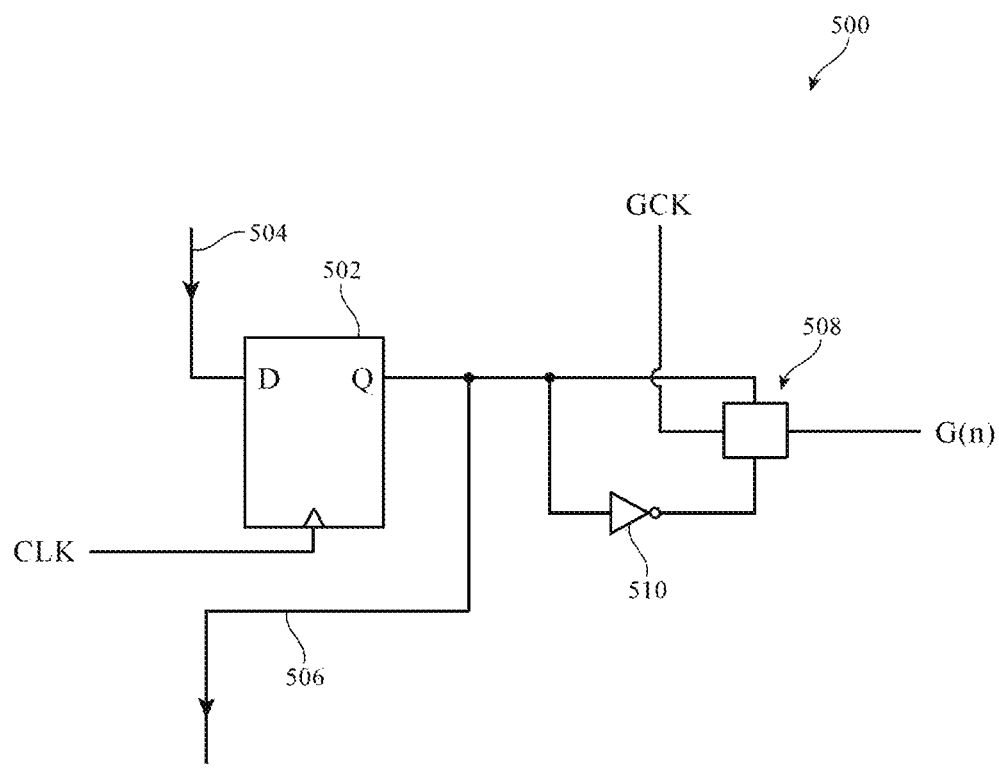
FIG. 22 is a diagram of a conventional digital gate driver unit.

FIG. 22 is a diagram of a conventional digital gate driver unit 500. Gate driver unit 500 includes a flip-flop 502, a transmission gate 508, and an inverter 510. Flip-flop 502 has a data input D that is coupled to a feed-forward path 504, a clock input that receives clock signal CLK, and a data output Q that is coupled to another feed-forward path 506. The transmission gate 508 has an n-channel transistor input that receives an output signal from the data output Q of the flip-flop 502, a p-channel transistor input that receives an inverted version of the output signal via inverter 510, a data input that receives gate clock signal GCK, and a data output on which gate driver output signal G(n) is provided. In this conventional arrangement, the signal at output Q of flip-flop 502 may be asserted during the IFP interval, which can undesirably degrade the re-channel and p-channel transistor in transmission gate 508 and cause visible line noise at the IFP row(s).

Figures 23, 24:
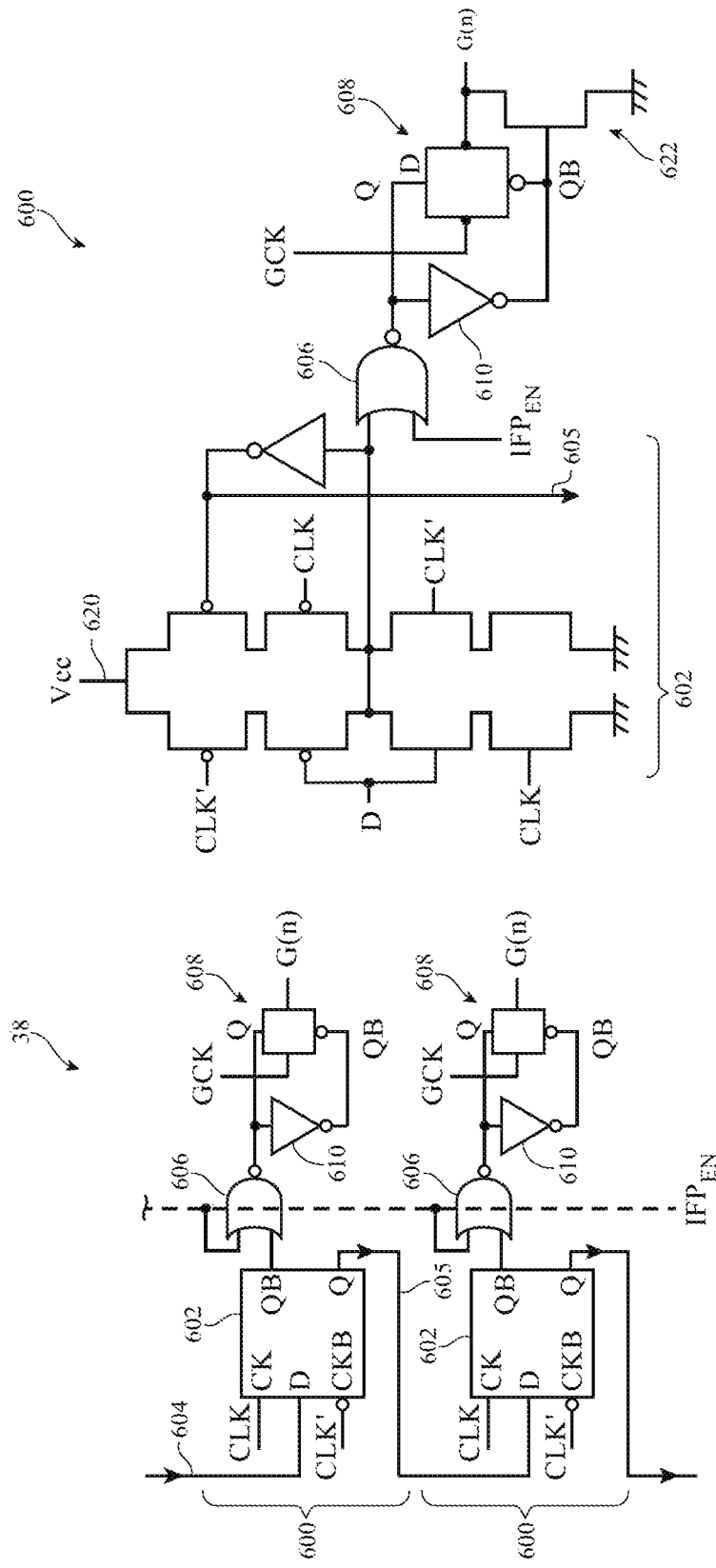
FIG. 23 is a diagram of illustrative digital gate driver units having flip-flop circuits and IFP gating logic in accordance with an embodiment of the present invention.
FIG. 24 is a circuit diagram of an illustrative digital gate driver unit of the type shown in FIG. 23 and that exhibits reduced stress in accordance with an embodiment of the present invention.

FIG. 23 is a diagram of illustrative gate driver units 600 having flip-flop circuits and IFP gating logic in accordance with an embodiment. As shown in FIG. 23, each gate driver unit 600 may include a digital flip-flop circuit 602 (sometimes referred to as a "D latch"), a logic NOR gate 606, a transmission gate 608, and an inverting circuit 610. Transmission gate 608 may include an n-channel transistor and a p-channel transistor coupled in parallel to pass signals from one source-drain terminal to another. Flip-flop circuit 602 in a given gate driver unit may have a data input D that receives signals from a preceding gate driver unit via path 604, clock inputs that receive clock signal CLK and clock signal CLK' (e.g., an inverted version of CLK), and a data output Q that is coupled to a succeeding gate driver unit via path 605.

Logic NOR gate 606 may have a first input that is coupled to the data bar output QB of flip-flop 602, a second input that receives an IFP control signal $IFP_{EN}$, and an output. Transmission gate 608 may have an n-channel transistor gate input terminal that receives an output signal from the output of gate 606, a p-channel transistor gate input terminal that receives an inverted version of the output signal from the output of gate 606 via inverter 610, a data input that receives a gate clock signal GCK, and a data output on which gate driver output signal G(n) is generated.

FIG. 24 shows a more detail implementation of gate driver unit 600. The particular circuit implementation of flip-flop 602 as shown in FIG. 24 is merely illustrative and does not serve to limit the scope of the present invention. In general, a logic NOR gate behaves like an inverter when one of its inputs is at logic zero but is configured to drive its output low when one of its inputs is at logic one. Therefore, gate driver unit 600 may be allowed to operate normally when IFP$_{EN}$ is low, but when IFP$_{EN}$ is asserted, logic NOR gate 606 may drive signal Q and QB low and high, respectively to completely deactivate transmission gate 608. Still referring to FIG. 24, an n-channel transistor 622 having its drain terminal coupled to the output of transmission gate 608, its gate terminal coupled to the output of inverter 610, and its source terminal coupled to ground may be turned on whenever transmission gate 608 is deactivated to pull gate driver unit output signal G(n) low.

Figure 25:
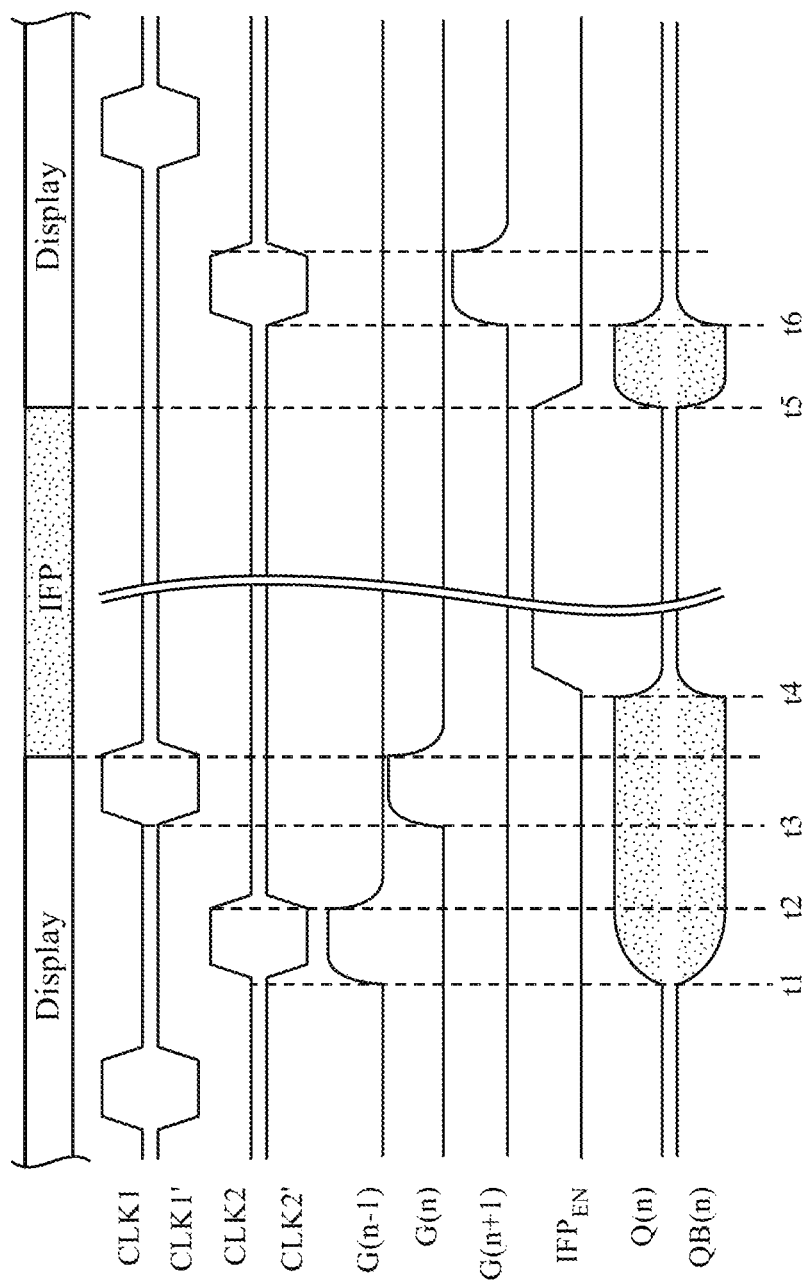
FIG. 25 is a timing diagram that illustrates the operation of the digital gate driver unit of FIG. 24 in accordance with an embodiment of the present invention.

FIG. 25 is a timing diagram that illustrates the operation of the digital gate driver unit of FIG. 24. At time t1, signal CLK2 may be pulsed high to assert gate driver output signal G(n−1) and a high voltage signal may be latched by the succeeding gate driver unit to assert signal Q(n) (i.e., which deasserts QB(n)). At time t2, CLK2 may be pulsed low to deassert gate driver output signal G(n−1). At time t3, signal CLK1 may be pulsed high to assert gate driver output signal G(n). Signal G(n) may be pulsed high since transmission gate 608 is activated by the asserted signals Q(n) and QB(n). At the beginning of the IFP period (time t4), control signal IFP$_{EN}$ may be asserted to force Q(n) and QB(n) low and high, respectively. Doing so turns off transmission gate 608 and helps to prevent transmission gate 608 from being exposed to a prolonged period of elevated stress levels during intra-frame pauses. At the end of the IFP interval (time t5), control signal IFP$_{EN}$ may be deasserted and signals Q(n) and QB(n) may be restored to their pre-IFP levels. At time t6, the clock signals may resume toggling to display the remainder of the frame.

Figure 26:
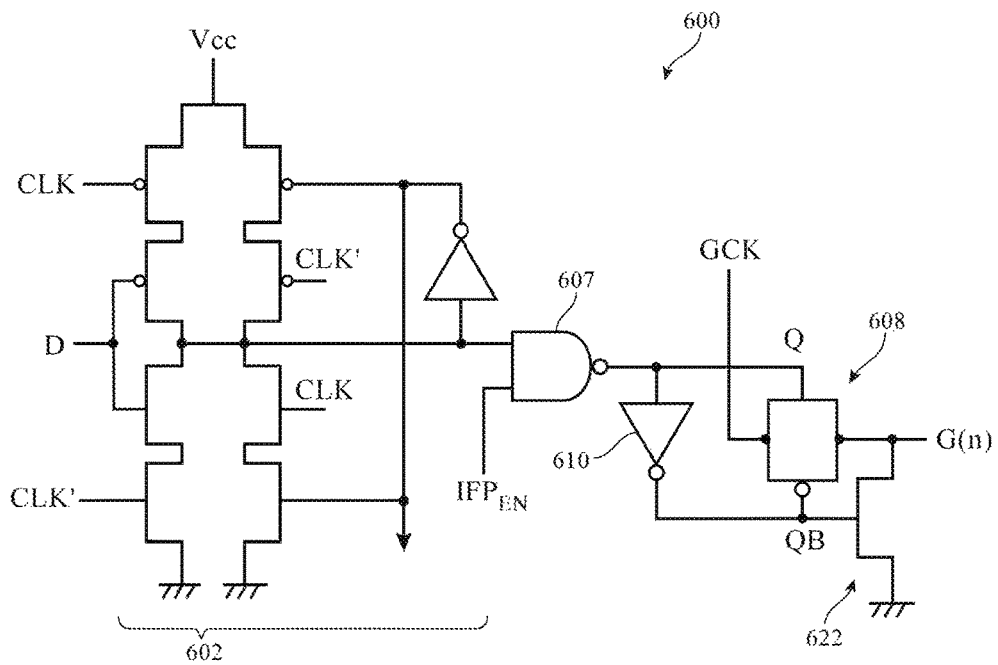
FIG. 26 is a circuit diagram of an illustrative digital gate driver unit having flip-flop circuits and that exhibits balanced stress in accordance with an embodiment of the present invention.

The example of FIGS. 23-25 in which the stress level is reduced via use of a logic NOR gate is merely illustrative. FIG. 26 shows another suitable arrangement of a gate driver unit 600 that is configured to balance/equalize the stress level that is applied to each gate driver unit (e.g., by applying an equal amount of elevated stress to each and every gate driver unit in the chain). As shown in FIG. 26, gate driver unit 600 may include a logic NAND gate 607 instead of a logic NOR gate. In particular, logic NAND gate 607 may have a first input that is coupled to the data output Q of flip-flop 602, a second input that receives an IFP control signal IFP$_{EN}$, and an output that is coupled to the control inputs of transmission gate 608.

In general, a logic NAND gate behaves like an inverter when one of its inputs is at logic one but is configured to drive its output high when one of its inputs is at logic zero. Therefore, gate driver unit 600 of FIG. 26 may be allowed to operate normally when IFP$_{EN}$ is high, but when IFP$_{EN}$ is asserted (e.g., when IFP$_{EN}$ is driven low), logic NAND gate 607 may drive signal Q and QB high and low, respectively to completely activate transmission gate 608.

Figure 27:
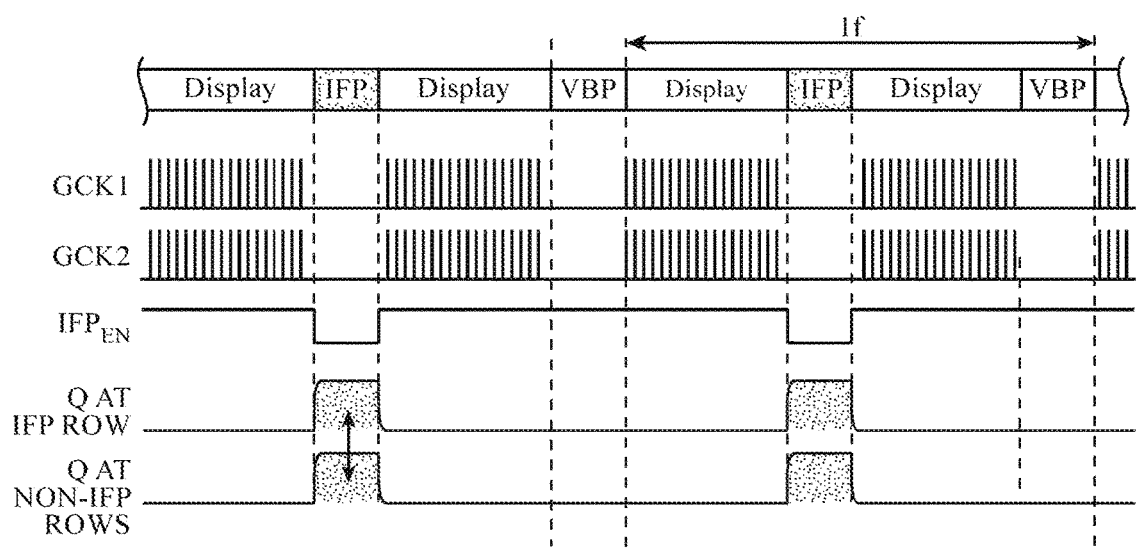
FIG. 27 is a timing diagram that illustrates the operation of the digital gate driver unit of FIG. 26 in accordance with an embodiment of the present invention.

FIG. 27 is a timing diagram that illustrates the operation of the digital gate driver unit of FIG. 26. As shown in FIG. 27, the gate clock signals GCK1 and GCK2 may take turns pulsing during each display interval to sequential assert the gate driver output signals in each row. During the display intervals, signal IFP$_{EN}$ may be deasserted (i.e., driven high). During an IFP period, however, IFP$_{EN}$ may be asserted (i.e., driven low) such that logic NAND gate 607 will charge up node Q in all the non-IFP rows so that the stress experienced by transmission gate 608 in the non-IFP rows is substantially equal to that experienced by transmission gate(s) 608 at or near the IFP row. The example of FIG. 27 in which signal IFP$_{EN}$ is asserted during the IFP interval is merely illustrative. If desired, signal IFP$_{EN}$ may instead be asserted during the vertical blanking interval VBP or other suitable time periods to balance the amount of stress applied across all of the gate driver units 600. If signal IFP$_{EN}$ is asserted during the vertical blanking period, the gate driver unit at the IFP row should not include the logic NAND gate 607 to prevent node Q from being asserted twice during each frame.

FIG. 28 is a diagram of illustrative gate driver units 700 having set-reset flip-flop (RS-FF) circuits and associated IFP gating logic in accordance with another embodiment. As shown in FIG. 28, each gate driver unit 700 may include a digital RS-FF circuit 702 (sometimes referred to as an "RS latch"), a logic NOR gate 706, a transmission gate 708, and an inverting circuit 710. Transmission gate 708 may include an n-channel transistor and a p-channel transistor coupled in parallel to pass signals from one source-drain terminal to another. Flip-flop circuit 702 in a given gate driver unit may have a set input S that receives an output signal from a preceding gate driver unit via path 704, a reset input R that receives an output signal from a succeeding gate driver unit via path 705, and a data bar output QB.

Logic NOR gate 706 may have a first input that is coupled to the data output QB of flip-flop 702, a second input that receives an IFP control signal IFP$_{EN}$, and an output. Transmission gate 608 may have an n-channel transistor gate input terminal that receives an output signal from the output of gate 706, a p-channel transistor gate input terminal that receives an inverted version of the output signal from the output of gate 706 via inverter 710, a data input that receives a gate clock signal GCK, and a data output on which gate driver output signal G(n) is generated.

FIG. 29 shows a more detail implementation of gate driver unit 700. The particular circuit implementation of RS flip-flop 702 as shown in FIG. 29 is merely illustrative and does not serve to limit the scope of the present invention. As described above, a logic NOR gate behaves like an inverter when one of its inputs is at logic zero but is configured to drive its output low when one of its inputs is at logic one. Therefore, gate driver unit 700 may be allowed to operate normally when IFP$_{EN}$ is low, but when IFP$_{EN}$ is asserted, logic NOR gate 706 may drive signal Q and QB low and high, respectively to completely deactivate transmission gate 708. Still referring to FIG. 29, an n-channel transistor 722 having its drain terminal coupled to the output of transmission gate 708, its gate terminal coupled to the output of inverter 710, and its source terminal coupled to ground may be turned on whenever transmission gate 708 is deactivated to pull gate driver unit output signal G(n) low.

Figure 30:
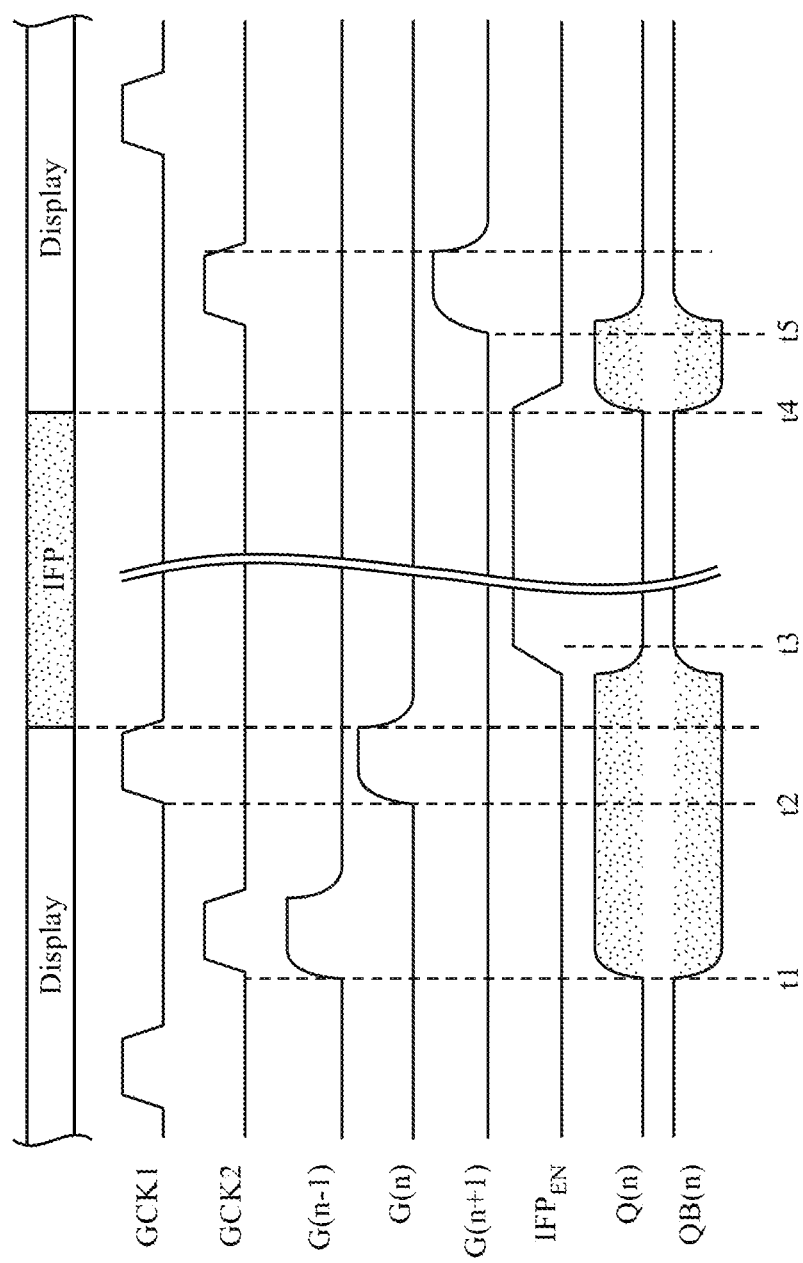
FIG. 30 is a timing diagram that illustrates the operation of the digital gate driver unit of FIG. 29 in accordance with an embodiment of the present invention.

FIG. 30 is a timing diagram that illustrates the operation of the digital gate driver unit of FIG. 29. At time t1, signal GCK2 may be pulsed high to assert gate driver output signal G(n−1). At this time, a high voltage signal may also be latched by the succeeding gate driver unit to assert signal Q(n). At time t2, signal GCK1 may be pulsed high to assert gate driver output signal G(n). Signal G(n) may be pulsed high since transmission gate 708 has already been activated by the asserted signals Q(n) and QB(n). At the beginning of the IFP period (time t3), control signal IFP$_{EN}$ may be asserted to force Q(n) and QB(n) low and high, respectively. Doing so turns off transmission gate 708 and helps to prevent transmission gate 708 from being exposed to a prolonged period of elevated stress levels during intra-frame pauses. At the end of the IFP interval (time t4), control signal IFP$_{EN}$ may be deasserted and signals Q(n) and QB(n) may be restored to their pre-IFP levels. At time t6, the clock signals may resume toggling to display the remainder of the frame. At this time, Q(n) and QB(n) may be reset to their deasserted states by feeding back an asserted G(n+1) via path 705 (see, e.g., FIG. 28).

Figure 31:
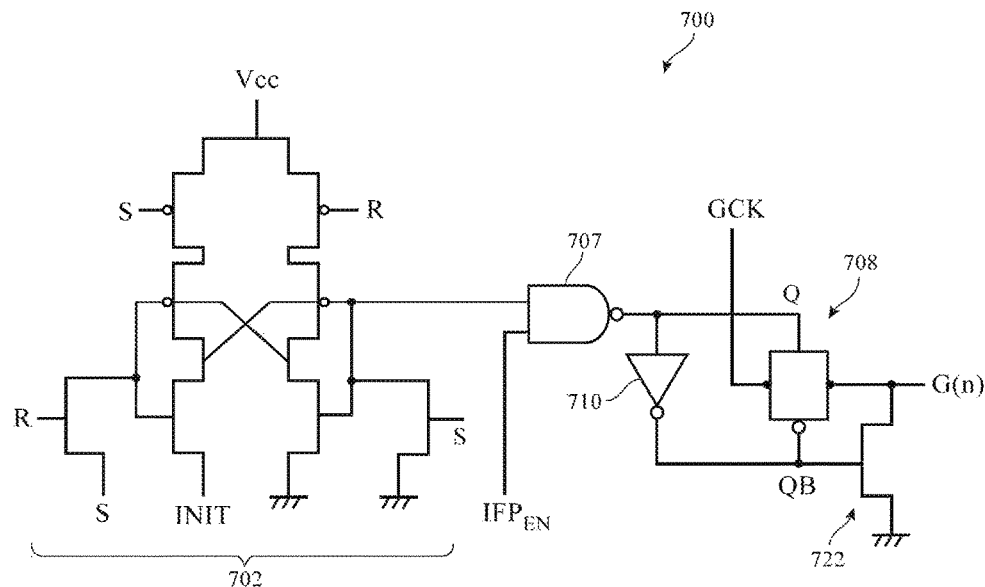
FIG. 31 is a circuit diagram of an illustrative digital gate driver unit having a set-reset latch and that exhibits balanced stress in accordance with an embodiment of the present invention.

The example of FIGS. 28-30 in which the stress level is reduced via use of a logic NOR gate is merely illustrative. FIG. 31 shows another suitable arrangement of a gate driver unit 700 that is configured to balance/equalize the stress level that is applied to each gate driver unit (e.g., by applying an equal amount of elevated stress to each and every gate driver unit in the chain). As shown in FIG. 31, gate driver unit 700 may include a logic NAND gate 707 instead of a logic NOR gate. In particular, logic NAND gate 707 may have a first input that is coupled to the data output Q of set-reset (RS) flip-flop 702, a second input that receives an IFP control signal $IFP_{EN}$, and an output that is coupled to the control inputs of transmission gate 708.

As described above, a logic NAND gate behaves like an inverter when one of its inputs is at logic one but is configured to drive its output high when one of its inputs is at logic zero. Therefore, gate driver unit 700 of FIG. 31 may be allowed to operate normally when $IFP_{EN}$ is high, but when $IFP_{EN}$ is asserted (e.g., when $IFP_{EN}$ is driven low), logic NAND gate 707 may drive signal Q and QB high and low, respectively to completely activate transmission gate 708.

Figure 32:
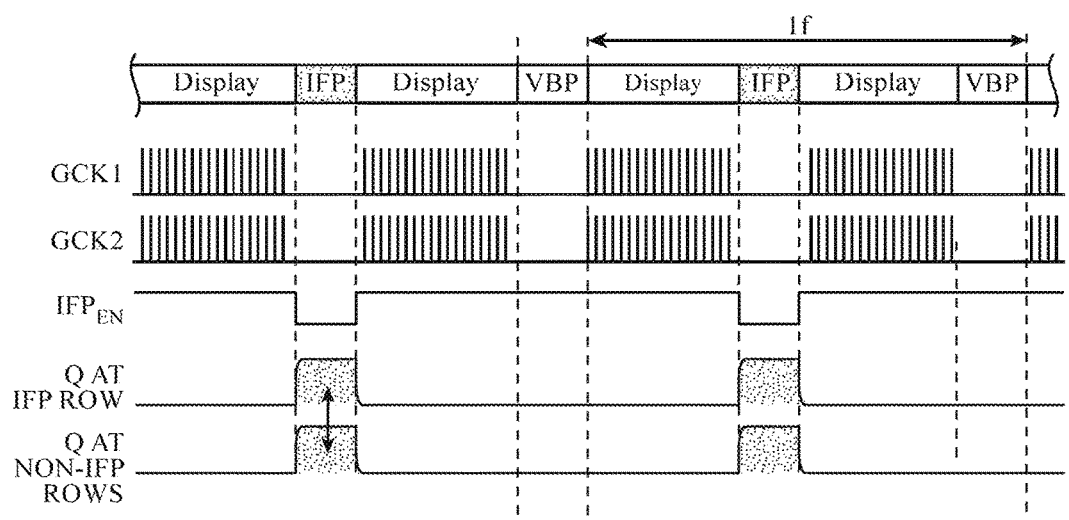
FIG. 32 is a timing diagram that illustrates the operation of the digital gate driver unit of FIG. 31 in accordance with an embodiment of the present invention.

FIG. 32 is a timing diagram that illustrates the operation of the digital gate driver unit of FIG. 31. As shown in FIG. 32, the gate clock signals GCK1 and GCK2 may take turns pulsing during each display interval to sequential assert the gate driver output signals in each row. During the display intervals, signal $IFP_{EN}$ may be deasserted (i.e., driven high). During an IFP period, however, $IFP_{EN}$ may be asserted (i.e., driven low) such that logic NAND gate 707 will charge up node Q in all the non-IFP rows so that the stress experienced by transmission gate 708 in the non-IFP rows is substantially equal to that experienced by transmission gate(s) 708 at or near the IFP row. The example of FIG. 32 in which signal $IFP_{EN}$ is asserted during the IFP interval is merely illustrative. If desired, signal $IFP_{EN}$ may instead be asserted during the vertical blanking interval VBP or other suitable time periods to balance the amount of stress applied across all of the gate driver units 700. If signal $IFP_{EN}$ is asserted during the vertical blanking period, the gate driver unit at the IFP row should not include the logic NAND gate 707 to prevent node Q from being asserted twice during each frame.

In general, the use of logic NOR gates and logic NAND gates to provide the desired voltage levels at the gate terminals of the transmission gates is merely illustrative. If desired, other types of logic gates such as logic OR gates, logic AND gates, logic XOR gates, logic XNOR gates, and other any other suitable type of digital logic circuitry can be used to selectively charge/discharge node Q and QB.

The foregoing is merely illustrative of the principles of this invention and various modifications can be made by those skilled in the art without departing from the scope and spirit of the invention. The foregoing embodiments may be implemented individually or in any combination.

What is claimed is:

1. Display circuitry, comprising:
   a display pixel array; and
   gate driver circuitry that is coupled to the display pixel array, wherein operation of the gate driver circuitry is temporarily suspended during an intra-frame pause (IFP) period, wherein the IFP period occurs when the gate driver circuitry is driving an intermediate row in the display pixel array, wherein the gate driver circuitry includes a plurality of gate driver units, and wherein a given gate driver unit in the plurality of gate driver units comprises:
   an output terminal that is coupled to a corresponding display pixel in the display pixel array;
   a drive transistor that passes a clock signal to the output terminal; and
   a control circuit that selectively applies a predetermined voltage onto a gate terminal of the drive transistor during the infra-frame pause period, wherein the control circuit receives an intra-frame pause (IFP) enable signal having a pulse that overlaps with a majority of the IFP period.

2. The display circuitry defined in claim 1, wherein the given gate driver unit further comprises:
   a capacitor having a first terminal that is connected to the gate terminal of the drive transistor and a second terminal that is connected to the output terminal.

3. The display circuitry defined in claim 2, wherein the given gate driver unit further comprises:
   a first additional transistor that is coupled between the output terminal and a ground line;
   a second additional transistor that is coupled between the gate terminal of the drive transistor and the ground line, wherein the first and second additional transistors have gate terminals that are coupled to another gate driver unit that succeeds the given gate driver unit in the plurality of gate driver units; and
   a third additional transistor that is coupled between the gate terminal of the drive transistor and another gate driver unit that precedes the given gate driver unit in the plurality of gate driver units.

4. The display circuitry defined in claim 1, wherein the control circuit is configured to charge the gate terminal of the drive transistor during the intra-frame pause period.

5. The display circuitry defined in claim 4, wherein the control circuit comprises:
   a pull-up transistor having a source terminal that is coupled to the gate terminal of the drive transistor, a drain terminal, and a gate terminal, wherein the drain and gate terminals of the pull-up transistor receive a first control signal that is asserted at the start of the intra-frame pause period; and
   a pull-down transistor having a drain terminal that is coupled to the gate terminal of the drive transistor, a source terminal that is coupled to ground, and a gate terminal that receives a second control signal that is asserted at the end of the intra-frame pause period.

6. The display circuitry of claim 1, wherein the gate driver circuitry further comprises a capacitor coupled to the drive transistor, and wherein the control circuit is directly connected to the gate terminal of the drive transistor.

7. The display circuitry of claim 1, wherein the control circuit receives an intra-frame pause (IFP) pulse signal having a pulse that is shorter in duration than the pulse of the IFP enable signal.

8. The display circuitry of claim 1, wherein the predetermined voltage is applied to the gate terminal of the drive transistor when the clock signal is idle at a ground power supply voltage level.

9. The display circuitry of claim 1, wherein the intra-frame pause period is within a given frame, wherein the gate driver circuitry is configured to load a first sub-frame of the given frame during a first display interval and to load a second sub-frame of the given frame during a second display interval, and wherein the intra-frame pause period is immediately after the first display interval and immediately before the second display interval.

10. The display circuitry of claim 1, wherein a drive transistor in an additional gate driver unit in the plurality of gate driver units does not receive the predetermined voltage during the intra-frame pause period.

11. Display circuitry, comprising:
a display pixel array; and
gate driver circuitry that is coupled to the display pixel array, wherein operation of the gate driver circuitry is temporarily suspended during an intra-frame pause (IFP) period, wherein the gate driver circuitry includes a plurality of gate driver units, and wherein a given gate driver unit in the plurality of gate driver units comprises:
  a output terminal that is coupled to a corresponding display pixel in the display pixel array;
  a drive transistor that passes a clock signal to the output terminal;
  a first capacitor that is coupled between a gate of the drive transistor and the output terminal; and
  a control circuit that selectively applies a predetermined voltage onto a gate terminal of the drive transistor during the infra-frame pause period, wherein the control circuit is configured to discharge the gate terminal of the drive transistor during the intra-frame pause period, and wherein the control circuit comprises:
    a second capacitor that is coupled to the gate terminal of the drive transistor;
    a first control transistor that is coupled in series with the second capacitor; and
    a second control transistor that is coupled in series with the first control transistor and that receives control signals that are asserted only during the intra-frame pause period.

12. The display circuitry defined in claim 11, wherein the first control transistor has a gate terminal that is coupled to the gate terminal of the drive transistor, and wherein the control circuit further comprises:
  an additional capacitor having a first terminal that is connected to the gate terminal of the drive transistor and a second terminal that is coupled to an intermediate node at which the first and second control transistors are connected.

13. The display circuitry defined in claim 11, wherein the control circuit further comprises:
  an additional capacitor having a first terminal that is coupled to a gate terminal of the first control transistor and a second terminal that is coupled to a ground line, wherein the additional capacitor remains fully charged during the entirety of the intra-frame pause period.

14. The display circuitry defined in claim 13, wherein the control circuit further comprises:
  a pull-up transistor that is coupled between the first terminal of the additional capacitor and another gate driver unit that precedes the given gate driver unit in the plurality of gate driver units; and
  a pull-down transistor that is coupled between the first terminal of the additional capacitor and another gate driver unit that succeeds the given gate driver unit in the plurality of gate driver units.

15. The display circuitry of claim 11, wherein the intra-frame pause period is within a given frame, wherein the gate driver circuitry is configured to load a first sub-frame of the given frame during a first display interval and to load a second sub-frame of the given frame during a second display interval, and wherein the intra-frame pause period is immediately after the first display interval and immediately before the second display interval.

16. The display circuitry of claim 11, wherein a drive transistor in an additional gate driver unit in the plurality of gate driver units does not receive the predetermined voltage during the intra-frame pause period.

\* \* \* \* \*